(12) United States Patent
Jeon et al.

(10) Patent No.: US 10,847,599 B2
(45) Date of Patent: Nov. 24, 2020

(54) DISPLAY PANEL

(71) Applicant: SAMSUNG DISPLAY CO., LTD., Yongin-si (KR)

(72) Inventors: Yujin Jeon, Yongin-si (KR); Daesuk Kim, Yongin-si (KR); Sukyoung Kim, Yongin-si (KR); Seungwoo Sung, Yongin-si (KR); Wonse Lee, Yongin-si (KR); Hyunji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 35 days.

(21) Appl. No.: 16/382,308

(22) Filed: Apr. 12, 2019

(65) Prior Publication Data

US 2020/0098843 A1 Mar. 26, 2020

(30) Foreign Application Priority Data

Sep. 21, 2018 (KR) .................. 10-2018-0114370

(51) Int. Cl.
*H01L 27/32* (2006.01)
*H01L 51/52* (2006.01)

(52) U.S. Cl.
CPC ...... *H01L 27/3276* (2013.01); *H01L 27/3258* (2013.01); *H01L 27/3265* (2013.01); *H01L 51/52* (2013.01)

(58) Field of Classification Search
CPC ............. H01L 27/3276; H01L 27/3246; H01L 27/3258; H01L 21/28; H01L 51/50; H01L 51/52
See application file for complete search history.

(56) References Cited

U.S. PATENT DOCUMENTS

| | | | |
|---|---|---|---|
| 7,830,591 B2 | 11/2010 | Shimodaira | |
| 8,350,792 B2 | 1/2013 | Igeta et al. | |
| 8,890,181 B2 | 11/2014 | Wang et al. | |
| 8,913,090 B2 | 12/2014 | Chung et al. | |
| 2003/0043307 A1* | 3/2003 | Nakayama | H01L 29/78669 349/43 |

(Continued)

FOREIGN PATENT DOCUMENTS

| | | |
|---|---|---|
| JP | 2010-032760 A | 2/2010 |
| JP | 5955298 B2 | 6/2016 |

(Continued)

*Primary Examiner* — Zandra V Smith
*Assistant Examiner* — John M Parker
(74) *Attorney, Agent, or Firm* — Kile Park Reed & Houtteman PLLC

(57) ABSTRACT

A display panel including a substrate including a transmissive area, a first non-display area surrounding the transmissive area, and a display area that at least partially surrounds the first non-display area; a display element in the display area and including a pixel electrode; a plurality of scan lines extending from the display area, arranged in the first non-display area, and detouring along an edge of the transmissive area; a connection line in the first non-display area, at least partially overlapping the plurality of scan lines, and on a same layer as that of the pixel electrode; and a first line and a second line on a layer different from that of the connection line, wherein the first line and the second line are connected to the connection line through contact holes.

20 Claims, 15 Drawing Sheets

(56) References Cited

U.S. PATENT DOCUMENTS

| | | | | |
|---|---|---|---|---|
| 2008/0117497 A1* | 5/2008 | Shimodaira | ....... | G02F 1/136286 |
| | | | | 359/296 |
| 2008/0203907 A1* | 8/2008 | Lee | ............... | H01L 51/5256 |
| | | | | 313/504 |
| 2008/0316402 A1* | 12/2008 | Fan Jiang | ........ | G02F 1/133707 |
| | | | | 349/114 |
| 2014/0197428 A1* | 7/2014 | Wang | ............. | G07F 17/32 |
| | | | | 257/88 |
| 2014/0346534 A1* | 11/2014 | Yao | ............. | G02F 1/134336 |
| | | | | 257/88 |
| 2017/0162637 A1 | 6/2017 | Choi et al. | | |
| 2019/0319212 A1* | 10/2019 | Park | ............. | H01L 27/3276 |

FOREIGN PATENT DOCUMENTS

| KR | 10-1127582 B1 | 3/2012 |
|---|---|---|
| KR | 10-2017-0066767 A | 6/2017 |

\* cited by examiner

DISPLAY PANEL

CROSS-REFERENCE TO RELATED APPLICATION

Korean Patent Application No. 10-2018-0114370, filed on Sep. 21, 2018, in the Korean Intellectual Property Office, and entitled: "Display Panel," is incorporated by reference herein in its entirety.

BACKGROUND

1. Field

Embodiments relate to a display panel.

2. Description of the Related Art

Recently, the purposes of a display device have become more diversified. Also, as a display device is thin and lightweight, a range of use thereof has gradually been extended.

As a display device is variously utilized, various methods may be used in designing a shape of the display device, and also, functionality that may be combined or made cooperate with the display device increases.

SUMMARY

The embodiments may be realized by providing a display panel including a substrate including a transmissive area, a first non-display area surrounding the transmissive area, and a display area that at least partially surrounds the first non-display area; a display element in the display area and including a pixel electrode; a plurality of scan lines extending from the display area, arranged in the first non-display area, and detouring along an edge of the transmissive area; a connection line in the first non-display area, at least partially overlapping the plurality of scan lines, and on a same layer as that of the pixel electrode; and a first line and a second line on a layer different from that of the connection line, wherein the first line and the second line are connected to the connection line through contact holes.

The plurality of scan lines may each extend in a first direction and include a curved portion in the first non-display area, and the connection line may extend in the first direction and includes a straight line portion in the first non-display area.

The connection line may be on a planarization layer having a flat top surface.

The display panel may further include a plurality of electrode voltage lines adjacent to the plurality of scan lines with an insulating layer therebetween and detouring along an edge of the transmissive area.

The plurality of scan lines may not overlap the plurality of electrode voltage lines.

The display panel may further include a driving thin film transistor in the display area, the driving thin film transistor including a driving gate electrode; and a storage capacitor in the display area, the storage capacitor overlapping the driving thin film transistor, wherein the plurality of scan lines are on the same layer as that of the driving gate electrode, and the plurality of electrode voltage lines are on the same layer as that of a second storage capacitor plate of the storage capacitor.

The display panel may further include a first scan circuit and a second scan circuit in a second non-display area surrounding the display area and the first non-display area, the first scan circuit and the second scan circuit being configured to provide a scan signal, wherein the transmissive area is partially surrounded by the display area, the first line is connected to the first scan circuit and extends along the second non-display area, and the second line is connected to the second scan circuit and extends along the second non-display area.

The display panel may further include a common power voltage wiring in the second non-display area, the common power voltage wiring surrounding at least a portion of the display area and being configured to transfer a common voltage to the display area, wherein the connection line is between the transmissive area and the common power voltage wiring.

The display panel may further include an electrode layer in the first non-display area, the electrode layer being on the same layer as that of the connection line and having an open ring shape.

The first non-display area may be entirely surrounded by the display area, and the first line and the second line may extend from the display area.

The connection line may extend in a first direction and the first line, and the second line may extend in a second direction intersecting with the first direction.

The embodiments may be realized by providing a display panel including a substrate including a transmissive area, a display area partially surrounding the transmissive area, and a non-display area outside the display area; a display element in the display area and including a pixel electrode; a first scan driving circuit and a second scan driving circuit in the non-display area with the display area therebetween; a first driving wiring extending from the first scan driving circuit; a second driving wiring extending from the second scan driving circuit; and a connection line connected to the first driving wiring and the second driving wiring through contact holes and being on the same layer as that of the pixel electrode, wherein the connection line is in the non-display area on one side of the transmissive area.

The first driving wiring and a second driving wiring may extend in a first direction and include a curved portion around the transmissive area, and the connection line may extend in the first direction and includes a straight line portion overlapping with the curved portion.

The connection line may be on a planarization layer having a flat top surface.

The display panel may further include a plurality of electrode voltage lines adjacent to the first driving wiring and a second driving wiring with an insulating layer therebetween and detouring around an edge of the transmissive area.

The display panel may further include an interlayer insulating layer covering the plurality of electrode voltage lines; a data line on the interlayer insulating layer; and a planarization layer covering the data line, wherein the first driving wiring and the second driving wiring are on the interlayer insulating layer, the connection line is on the planarization layer, and a thickness of the planarization layer is greater than a thickness of the interlayer insulating layer.

The display panel may further include a driving thin film transistor in the display area, the driving thin film transistor including a driving gate electrode; and a storage capacitor in the display area, the storage capacitor overlapping the driving thin film transistor, wherein the plurality of scan lines are on the same layer as that of the driving gate electrode, and the plurality of electrode voltage lines are on the same layer as that of a second storage capacitor plate of the storage capacitor.

The plurality of scan lines may not overlap the plurality of electrode voltage lines.

The display panel may further include a common power voltage wiring in the non-display area, the common power voltage wiring surrounding at least a portion of the display area and being configured to transfer a common voltage to the display area, wherein the connection line is between the transmissive area and the common power voltage wiring.

The display panel may further include an electrode layer around the transmissive area, the electrode layer being on the same layer as that of the connection line and having an open ring shape.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
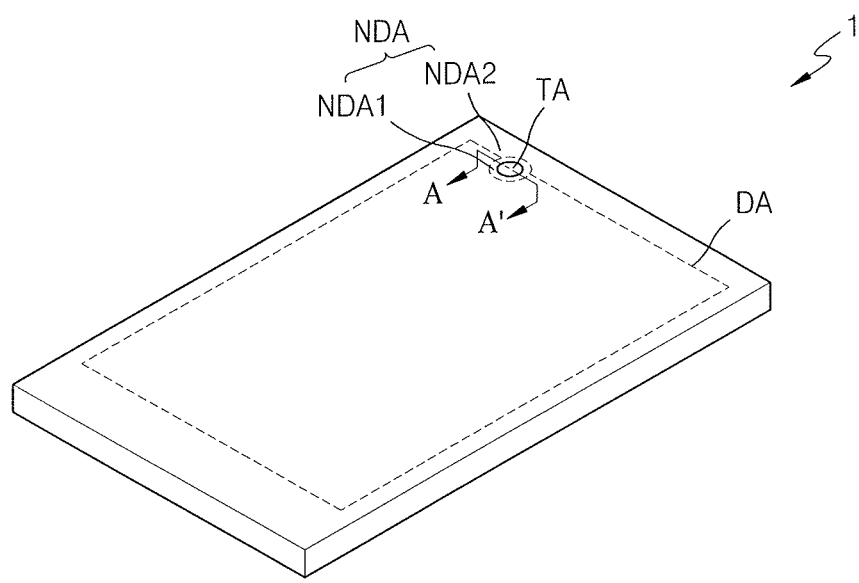
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

As used herein, when an element is referred to as being on a same layer as another element, the one element may have a surface that is coplanar with a surface of the other element and/or the one element is directly on the same layer as the other element.

FIG. 1 illustrates a perspective view of a display device 1 according to an embodiment.

Referring to FIG. 1, the display device 1 may include a display area DA that emits light and a non-display area NDA that does not emit light. The display device 1 may provide a predetermined image by using light emitted from a plurality of pixels arranged in the display area DA.

The display device 1 may include a transmissive area TA. The transmissive area TA may be at least partially surrounded by the display area DA. In an implementation, as illustrated in FIG. 1, the transmissive area TA may be located in an edge of the display area DA and may be partially surrounded by the display area DA.

The transmissive area TA may correspond to an area through which light and/or sounds output from an electronic element to the outside or progressing from the outside toward the electronic element may pass. In an implementation, in the case where light passes through the transmissive area TA, light transmittance may be about 50% or more, e.g., about 70% or more, about 75% or more, about 80% or more, 85% or more, or 90% or more.

The non-display area NDA surrounds the display area DA. A portion of the non-display area NDA may be between the display area DA and the transmissive area TA. Hereinafter, for convenience of description, an area of the non-display area NDA that surrounds the transmissive area TA is referred to as a first non-display area NDA1, and the rest of the non-display area NDA is referred to as a second non-display area NDA2.

The first non-display area NDA1 may surround the transmissive area TA, and a portion of the first non-display area NDA1 is located between the display area DA and the transmissive area TA. The display area DA partially surrounds the first non-display area NDA1.

The second non-display area NDA2 may extend along an edge of the display device 1, and the first non-display area NDA1 may be connected to the second non-display area NDA2. For example, the first non-display area NDA1 may entirely surround the transmissive area TA, the display area DA may entirely or at least partially surround the first non-display area NDA1, and the second non-display area NDA2 may entirely surround the display area DA and the first non-display area NDA1.

In an implementation, the display device 1 may be an organic light-emitting display device. In an implementation, various types of display devices such as an inorganic light-emitting display, a quantum dot light-emitting display, and a liquid crystal display may be used.

In an implementation, as illustrated in FIG. 1, the transmissive area TA may be at one side (upper left side) of the display area DA, which may have a quadrangular shape. In an implementation, the display area DA may have a circular shape, an elliptical shape, or a polygonal shape such as a triangular shape or a pentagonal shape, and a size, a shape, the number of, and a location of the transmissive area TA may be variously modified.

Figure 2A:
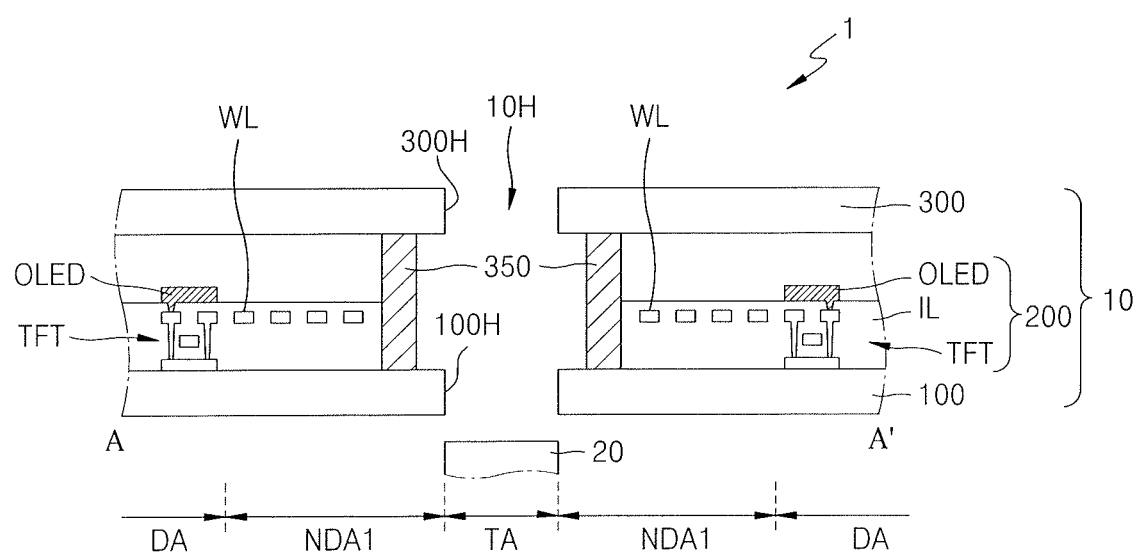
FIGS. 2A to 2C illustrate cross-sectional views of a display device according to embodiments.
Figure 2B:
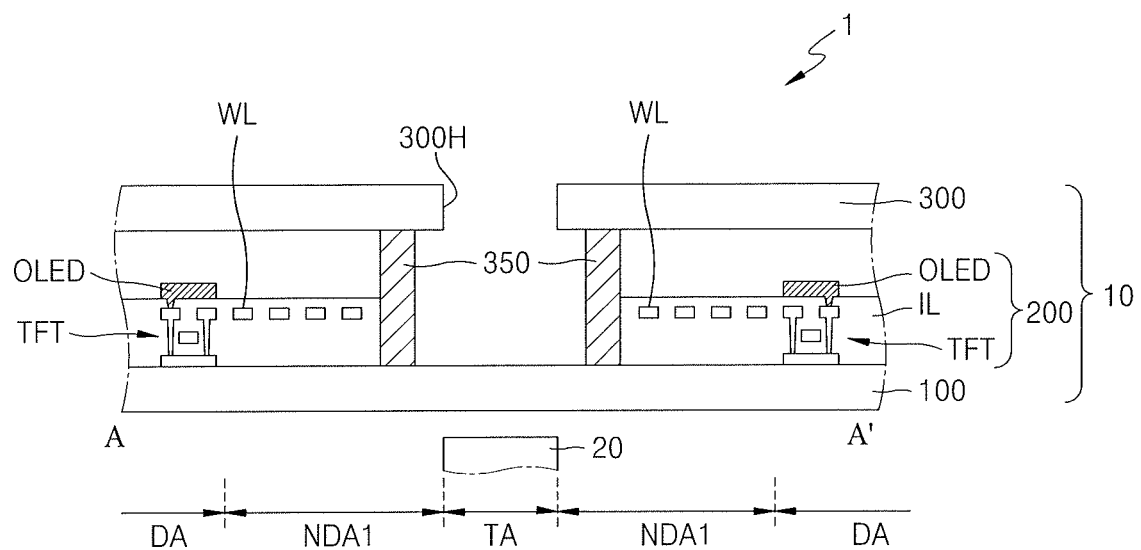
Figure 2C:
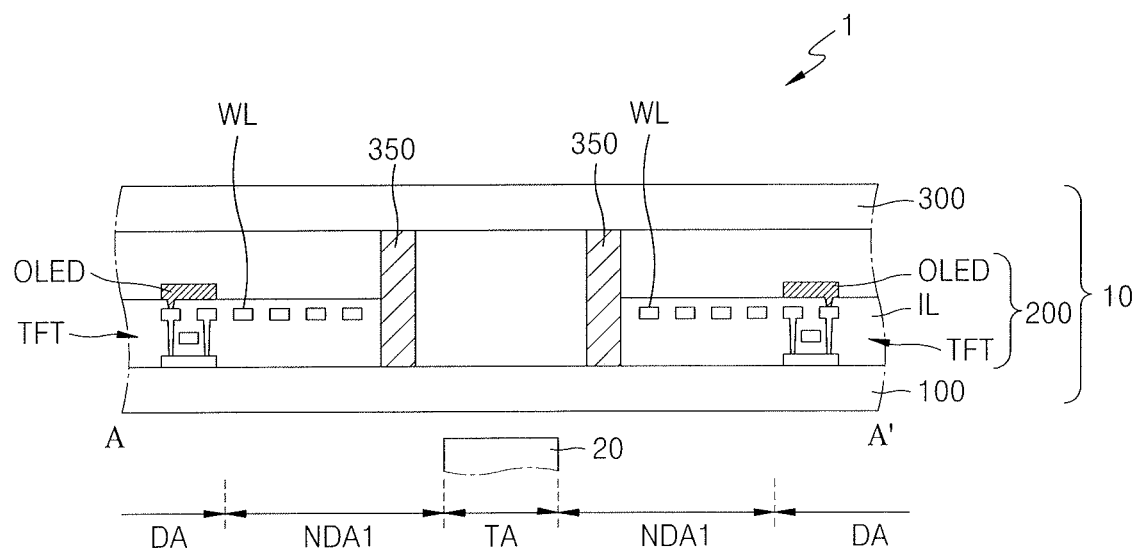

FIGS. 2A to 2C illustrate cross-sectional views of the display device 1 according to embodiments, and correspond to a cross-section taken along line A-A' of FIG. 1.

Referring to FIG. 2A, the display device 1 may include a display panel 10 including display elements, and a component 20 corresponding to, aligned with, or underlying the transmissive area TA.

The display panel 10 may include a substrate 100, an encapsulation substrate 300 (as an encapsulation member facing the substrate 100), and a display element layer 200 arranged therebetween. A sealing material 350 (sealant) covering a lateral surface of the display element layer 200 may be between the substrate 100 and the encapsulation substrate 300. In an implementation, as illustrated in FIG. 2A, sealing materials 350 may be respectively arranged on two opposite sides of the transmissive area TA, when viewed from a direction perpendicular to a main surface of the substrate 100, and the transmissive area TA may be understood as being entirely surrounded by the sealing materials 350.

The substrate 100 may include glass or a polymer resin. The polymer resin may include, e.g., polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 100 including the polymer resin may be flexible, rollable, or bendable. The substrate 100 may have a multi-layered structure including a layer including the above-described polymer resin and an inorganic layer. The encapsulation substrate 300 may include glass or the above-described polymer resin.

The display element layer 200 may include a circuit layer including a thin film transistor TFT, an organic light-emitting diode (OLED) as a display element connected to the thin film transistor TFT, and at least one insulating layer IL therebetween. The thin film transistor TFT and the OLED connected thereto may be in the display area DA, and some wirings WL of the display element layer 200 may be located in the first non-display area NDA1. The wirings WL may provide a predetermined signal or voltage to pixels spaced apart from each other with the transmissive area TA therebetween. In an implementation, as illustrated in FIG. 2A, the wirings WL may not overlap the sealing material 350 in the first non-display area NDA1. In an implementation, a portion of the sealing material 350 may also be arranged over the wirings WL.

The display panel 10 may include a through hole 10H corresponding to the transmissive area TA. For example, the substrate 100 and the encapsulation substrate 300 may respectively include through holes 100H and 300H corresponding to the transmissive area TA. Also, the display element layer 200 may include a through hole corresponding to the transmissive area TA.

In an implementation, an element such as an input detector to detect a touch input, a reflection preventer including a polarizer, a retarder, a color filter, and/or a black matrix, and a transparent window may be further arranged over or on the display panel 10.

The component 20 may be located in the transmissive area TA. The component 20 may be an electronic element that uses (e.g., senses or outputs) light or sounds. For example, an electronic element may be a sensor such as an infrared sensor that receives and uses light, a camera that receives light and captures an image, a sensor that outputs and senses light or sounds to measure a distance or recognize a fingerprint, a small lamp that outputs light, or a speaker that outputs sounds. An electronic element that uses light may use light in various wavelength bands such as visible light, infrared light, and ultraviolet light. In the case where the display panel 10 includes the through hole 10H corresponding to the transmissive area TA, light or sounds output or received by an electronic element may be more effectively utilized.

Unlike FIG. 2A in which the display panel 10 includes the through hole 10H corresponding to the transmissive area TA, some elements of the display panel 10 may not include a through hole. For example, as illustrated in FIG. 2B, the encapsulation substrate 300 may include the through hole 300H corresponding to the transmissive area TA, and the substrate 100 may not include a through hole. In an implementation, as illustrated in FIG. 2C, both the substrate 100 and the encapsulation substrate 300 may not include through holes corresponding to the transmissive area TA. As illustrated in FIGS. 2B and 2C, even though the substrate 100 does not include the through hole 100H, portions of the display panel 10 corresponding to the transmissive area TA may be removed and thus light transmittance for an electronic element may be secured. In the case where the display device 1 includes the display panel 10 shown in FIGS. 2B and 2C, it may be appropriate to use an electronic element that uses light as the electronic element.

In an implementation, the component 20 may be located inside the through hole 10H to overlap lateral surfaces of the display panel 10 that define the through hole 10H.

The component 20 may be another member other than the above-described electronic element. In an implementation, in the case where the display panel 10 is used in a smart watch or an instrument panel for an automobile, the component 20 may be a member including a needle of a clock or a needle indicating predetermined information (e.g. the velocity of a vehicle, etc.). In an implementation, the component 20 may include an element such as an accessory that increases an aesthetic sense of the display panel 10.

Figure 3A:
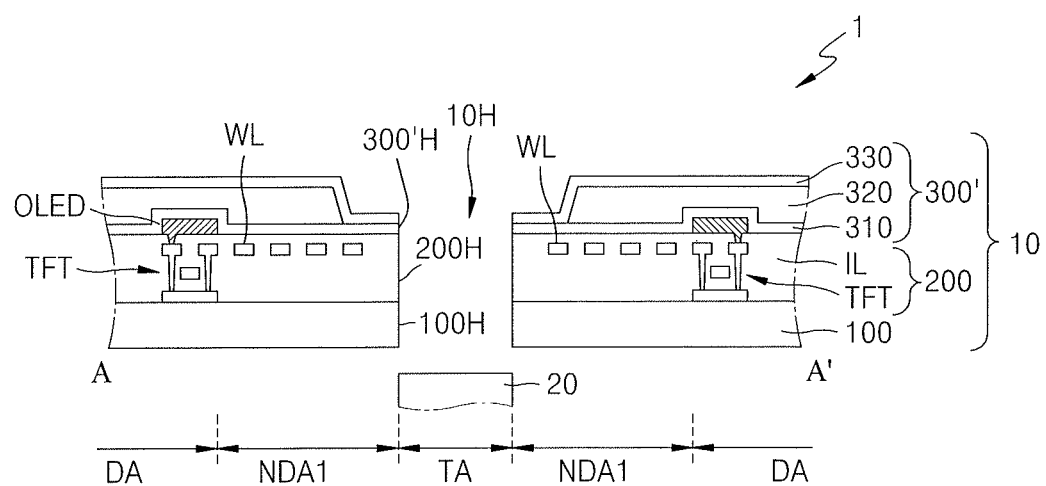
FIGS. 3A to 3C illustrate cross-sectional views of a display device according to other embodiments.
Figure 3B:
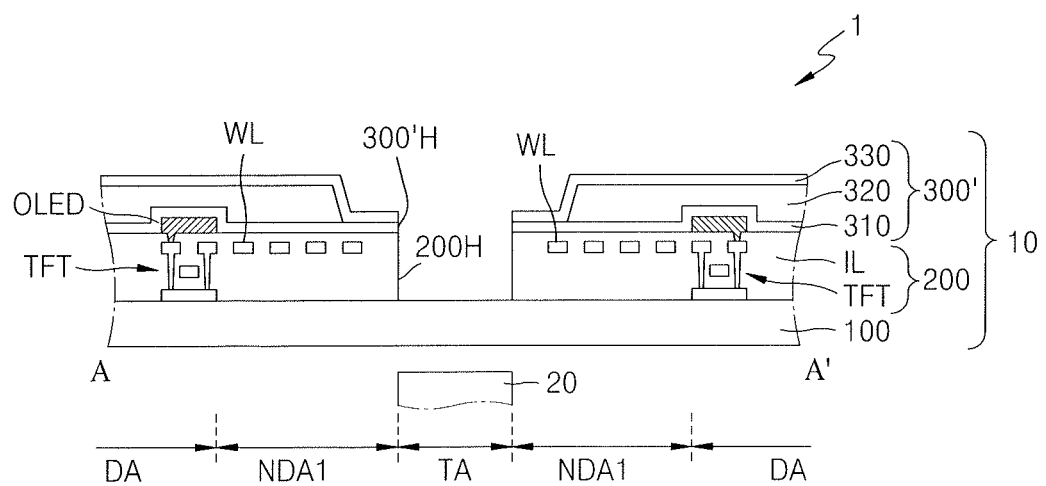
Figure 3C:
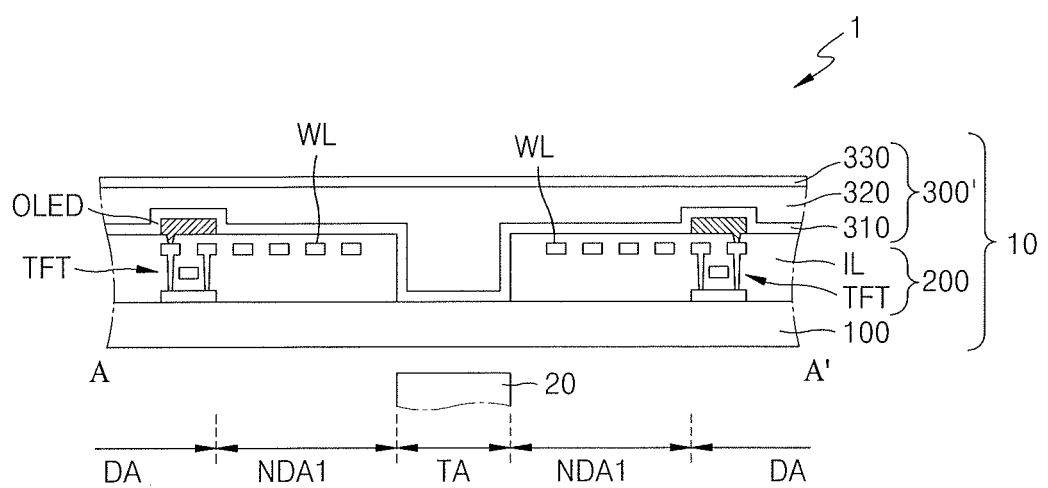

FIGS. 3A to 3C illustrate cross-sectional views of a display device according to other embodiments, and correspond to a cross-section taken along line A-A' of FIG. 1.

Referring to FIG. 3A, like the display device 1 described above with reference to FIG. 2A, the display device 1 may include the display panel 10 and the component 20. In an implementation, the display device 1 may further include an input detector, a reflection prevention member, a window, etc. on the display panel 10.

Unlike the display panel 10 described above with reference to FIG. 2A that includes the encapsulation substrate 300 as an encapsulation member and the sealing material 350, the display panel 10 according to the present embodiment may include a thin-film encapsulation layer 300' as an encapsulation member. In this case, flexibility of the display panel 10 may be even more improved. For convenience of description, differences are mainly described below.

The thin-film encapsulation layer 300' may include at least one inorganic encapsulation layer and at least one organic encapsulation layer. With regard to this, FIG. 3A illustrates first and second inorganic encapsulation layers 310 and 330 and an organic encapsulation layer 320 therebetween.

The first and second inorganic encapsulation layers 310 and 330 may include one or more inorganic insulating materials among, e.g., silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The organic encapsulation layer 320 may include a polymer-based material. The polymer-based material may include, e.g., an acrylic-based resin, an epoxy-based resin, PI, and polyethylene.

The display panel 10 may include the through hole 10H corresponding to or at the transmissive area TA. For example, the substrate 100 and the thin-film encapsulation layer 300' may respectively include through holes 100H and 300'H. The first and second inorganic encapsulation layers 310 and 330 and the organic encapsulation layer 320 may respectively include holes corresponding to the transmissive area TA. In an implementation, a size of the hole of the organic encapsulation layer 320 may be greater than sizes of the holes respectively of the first and second inorganic encapsulation layers 310 and 330. For example, the first and second inorganic encapsulation layers 310 and 330 may contact each other around the transmissive area TA.

Unlike FIG. 3A, in which the display panel 10 includes the through hole 10H corresponding to the transmissive area TA, the display panel 10 may not include the through hole 10H. In an implementation, as illustrated in FIG. 3B, the thin-film encapsulation layer 300' may include the through hole 300'H corresponding to the transmissive area TA, and the substrate 100 may not include the through hole 100H. In an implementation, as illustrated in FIG. 3C, both the substrate 100 and the thin-film encapsulation layer 300' may not include through holes corresponding to or at the transmissive area TA. In an implementation, as illustrated in FIGS. 3B and 3C, the substrate 100 may not include the through hole 100H, portions of the display panel 10 corresponding to the transmissive area TA may be removed, and thus light transmittance for an electronic element may be secured as described above.

In the case where the thin-film encapsulation layer 300' does not include the through hole as illustrated in FIG. 3C, each of at least one inorganic encapsulation layer and at least one organic encapsulation layer may cover the substrate 100 in the transmissive area TA. In this case, a portion of the display element layer 200 between the substrate 100 and the thin-film encapsulation layer 300' corresponding to the transmissive area TA may be removed. In an implementation, as illustrated in FIG. 3A, a portion of the insulating layer IL corresponding to the transmissive area TA may be entirely removed. In an implementation, only some sub-layers of the insulating layer IL, which is a multi-layer, may be removed.

FIGS. 3A to 3C illustrate the component 20 located under the display panel 10. In an implementation, the component 20 may be located inside the through hole 10H, e.g., inside the through hole 100H of the substrate 100, the through hole 200H of the display element layer 200, and the through hole 300H of the thin-film encapsulation layer 300'. In an implementation, the component 20 may be located over the substrate 100 and inside the through hole 200H of the display element layer 200 of FIG. 3B.

FIGS. 2A to 2C show that the display panel 10 includes only the encapsulation substrate 300 as an encapsulation member and FIGS. 3A to 3C show that the display panel 10 includes only the thin-film encapsulation layer 300 as an encapsulation member. In an implementation, the display panel 10 may include both one of the encapsulation layer 300 shown in FIGS. 2A to 2C and one of the thin-film encapsulation layers 300' shown in FIGS. 3A to 3C.

Figure 4:
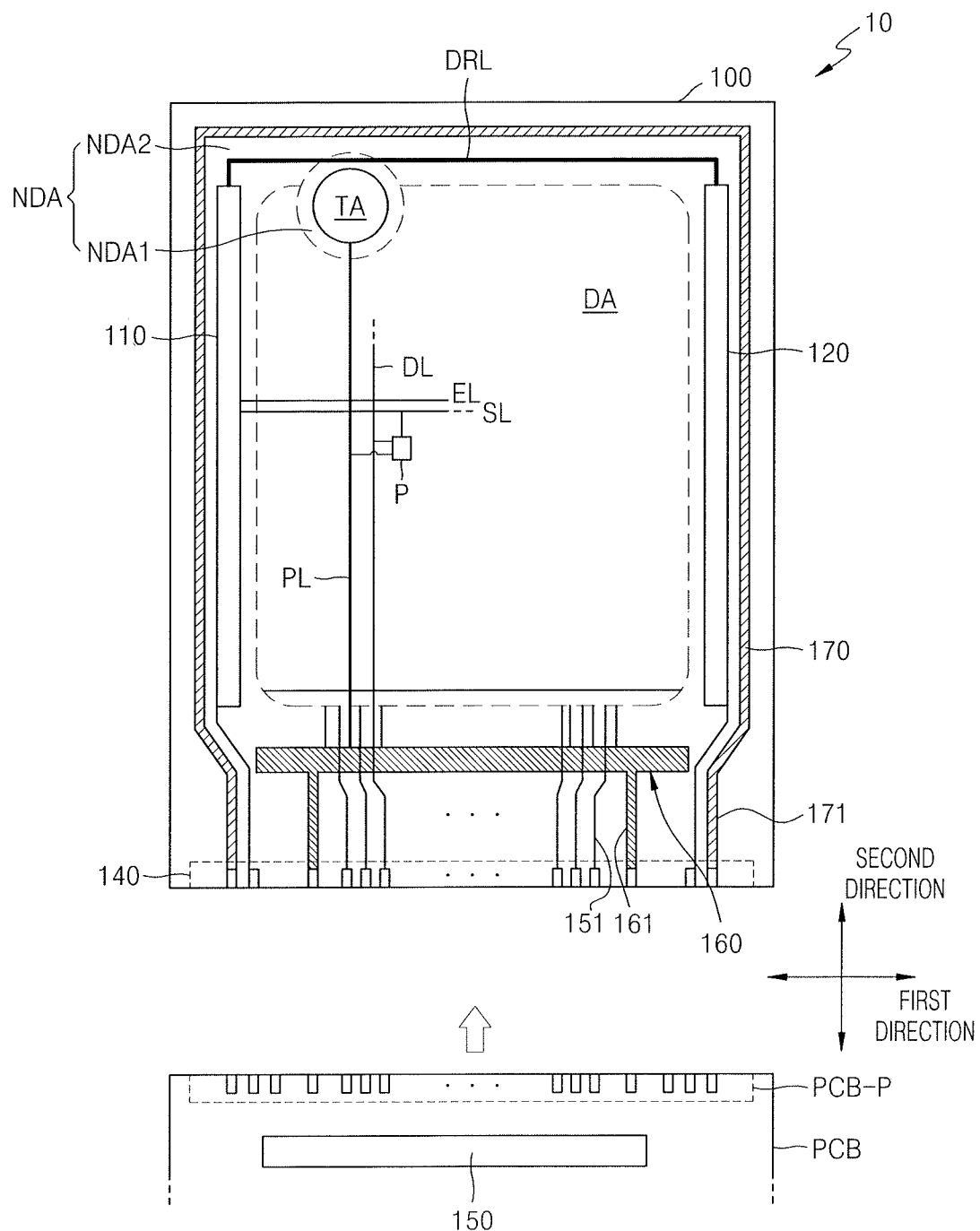
FIG. 4 illustrates a plan view of a display panel according to an embodiment.

FIG. 4 is a plan view of the display panel 10 according to an embodiment. Referring to FIG. 4, the display panel 10 may include a plurality of pixels P in the display area DA. Each of the pixels P may include a display element such as an OLED. Each pixel P may emit, e.g., red, green, blue, or white light through the OLED. In the present specification, a pixel P may be understood as a pixel that emits light of one of red, green, blue, and white colors as described above. The display area DA may be protected from external air or moisture by being covered by the encapsulation member described with reference to FIGS. 2A to 3C.

The transmissive area TA may be at an edge of the display area DA and may be partially surrounded by the display area DA. For example, a plurality of pixels P may be around or adjacent to the transmissive area TA. The plurality of pixels P may surround at least a portion of the transmissive area TA. The first non-display area NDA1, in which pixels P are not arranged, may be between the transmissive area TA and the display area DA. Wirings to apply a predetermined signal or power to pixels P (spaced apart from each other around an opening area or the transmissive area TA) may detour around the first non-display area NDA1. In an implementation, some of the wirings may be disconnected with the transmissive area TA therebetween.

Each pixel P may be electrically connected with outer circuits in the non-display area NDA, e.g., the second non-display area NDA2. A first scan driving circuit 110, a second scan driving circuit 120, a terminal 140, a data driving circuit 150, a first power supply line 160, and a second power supply line 170 may be arranged in the second non-display area NDA2.

The first scan driving circuit 110 may provide a scan signal to each pixel P through a scan line SL. The first scan driving circuit 110 may provide an emission control signal to each pixel through an emission control line EL. The second scan driving circuit 120 may be arranged with or aligned opposite to the first scan driving circuit 110 side by side with the display area DA therebetween. Some pixels P in the display area DA may be electrically connected with the first scan driving circuit 110, and the other pixels P may be electrically connected with the second scan driving circuit 120.

The first scan driving circuit 110 and the second scan driving circuit 120 may be connected to each other by a driver line DRL. The driver line DRL may be provided as a plurality of driver lines DRL which may respectively transmit a gate driving high voltage Vgh, a gate driving low voltage Vgl, and a start signal FLM. Here, the gate driving high voltage Vgh and the gate driving low voltage Vgl may be voltages for driving the first scan driving circuit 110 and the second scan driving circuit 120. The first scan driving circuit 110 and the second scan driving circuit 120 may be connected to each other by the driver line DRL, and a brightness deviation of the display device 1 may be minimized.

The driver line DRL may be in the non-display area NDA, and a portion of the driver line DRL may be in the first non-display area NDA1 around the transmissive area TA. Various detouring lines may be arranged in the first non-display area NDA1 around the transmissive area TA. In an implementation, to minimize interference with the detouring lines, a portion of the driver line DRL may be provided as a driving connection line arranged in a different layer of the first non-display area NDA1, which will be described below.

The terminal 140 may be on or at one side of the substrate 100. The terminal 140 may not be covered by an insulating layer, but instead may be exposed and electrically connected to a printed circuit board PCB. A terminal PCB-P of the printed circuit board PCB may be electrically connected to the terminal 140 of the display panel 10. The printed circuit board PCB transfers a signal of a controller or power to the display panel 10. Control signals generated by the controller may be respectively transferred to the first scan driving circuit 110 and the second scan driving circuit 120. The controller may respectively provide a driving voltage ELVDD and a common voltage ELVSS (see FIG. 5) to the first power supply line 160 and the second power supply line 170 through a first connection line 161 and a second connection line 171.

The driving voltage ELVDD may be provided to each pixel P through a driving voltage line PL connected to the first power supply line 160, and the common voltage ELVSS may be provided to an opposite electrode of a pixel P connected to the second power supply line 170. The second power supply line 170 may partially surround the display area DA in a loop shape whose one side is open.

The data driving circuit 150 may be electrically connected to a data line DL. A data signal of the data driving circuit 150 may be provided to each pixel P through a connection line 151 connected to the terminal 140 and the data line DL connected to the connection line 151. In an implementation, as illustrated in FIG. 4, the data driving circuit 150 may be in or on the printed circuit board PCB. In an implementation, the data driving circuit 150 may be on the substrate 100. For example, the data driving circuit 150 may be between the terminal 140 and the first power supply line 160.

The first power supply line 160 may be connected to the first connection line 161 and may receive the driving voltage ELVDD from the controller connected to the terminal 140. The first power supply line 160 may correspond to all pixel columns arranged in a first direction and may transfer the driving voltage ELVDD to each of the pixels P.

Figure 5:
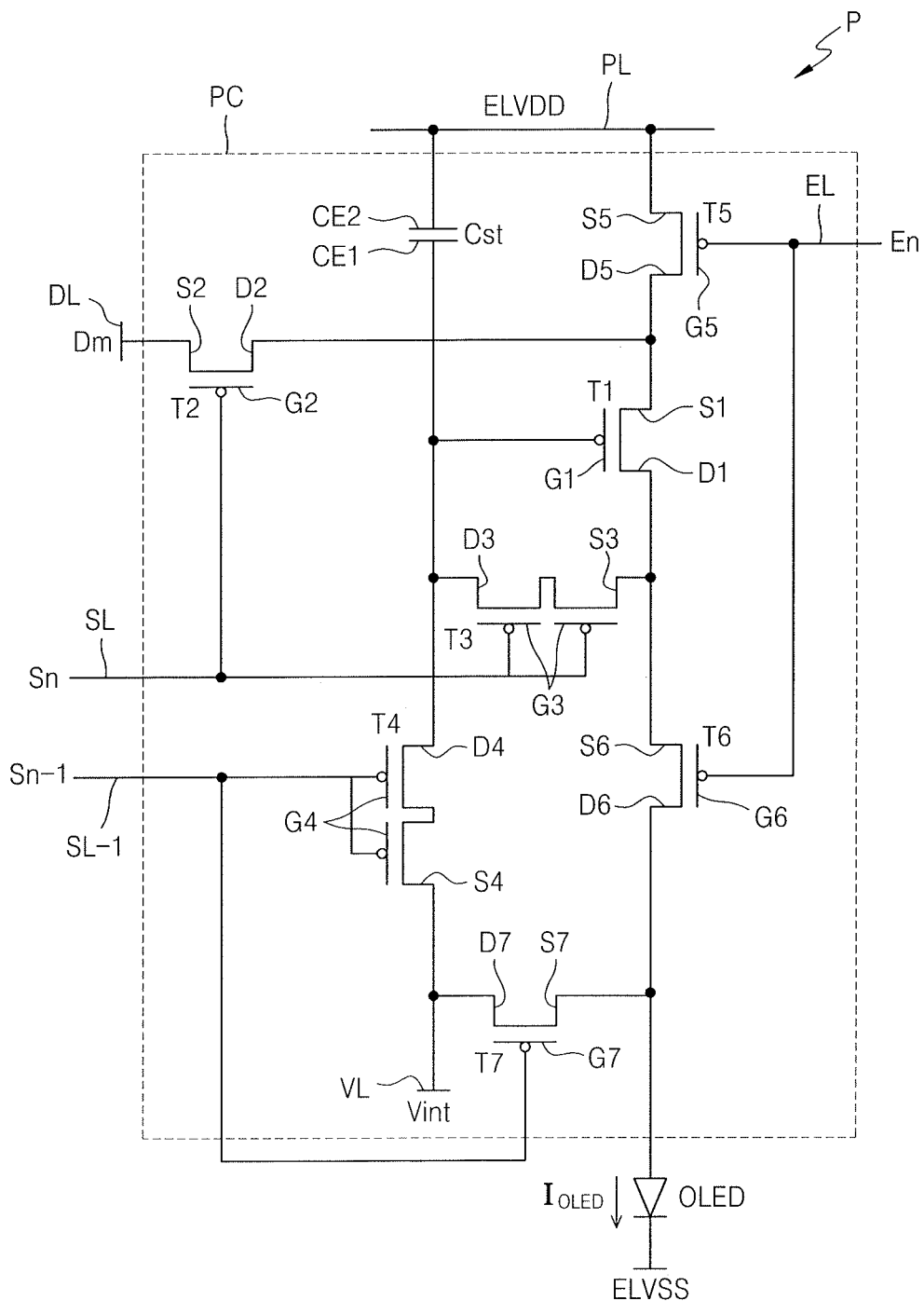
FIG. 5 illustrates an equivalent circuit diagram of one of the pixels of a display panel according to an embodiment.

FIG. 5 illustrates an equivalent circuit diagram of one of the pixels of a display panel according to an embodiment.

Referring to FIG. 5, the pixel P may include a pixel circuit PC and an OLED connected to the pixel circuit PC. The pixel circuit PC may include a plurality of thin film transistors and a storage capacitor Cst. The thin film transistors and the storage capacitor Cst may be connected to signal lines SL, SL-1, EL and DL, an initialization voltage line VL, and a driving voltage line PL.

In an implementation, as illustrated in FIG. 5, each pixel P may be connected to the signal lines SL, SL-1, EL and DL, the initialization voltage line VL, and the driving voltage line PL. In an implementation, at least one of the signal lines SL, SL-1 EL and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines may include the scan line SL to transfer a scan signal Sn, the previous scan line SL-1 to transfer a previous scan signal Sn-1 to the first initialization thin film transistor T4 and the second initialization thin film transistor T7, an emission control line EL to transfer an emission control signal En to the operation control thin film transistor T5 and the emission control thin film transistor T6, and the data line DL intersecting with the scan line SL and configured to transfer a data signal Dm. The driving voltage line PL transfers the driving voltage ELVDD to the driving thin film transistor T1, and the initialization voltage line VL transfers an initialization voltage Vint that initializes the driving thin film transistor T1 and a pixel electrode.

A driving gate electrode G1 of the driving thin film transistor T1 may be connected to a first storage capacitor plate CE1 of the storage capacitor Cst, a driving source electrode S1 of the driving thin film transistor T1 may be connected to the driving voltage line PL through the operation control thin film transistor T5, and a driving drain electrode D1 of the driving thin film transistor T1 may be electrically connected with the pixel electrode of the OLED through the emission control thin film transistor T6. The driving thin film transistor T1 may receive a data signal Dm and may supply a driving current $I_{OLED}$ to the OLED in response to a switching operation of the switching thin film transistor T2.

A switching gate electrode G2 of the switching thin film transistor T2 may be connected to the scan line SL, a switching source electrode S2 of the switching thin film transistor T2 may be connected to the data line DL, and a switching drain electrode D2 of the switching thin film transistor T2 may be connected to the driving source electrode S1 of the driving thin film transistor T1 and connected to the driving voltage line PL through the operation control thin film transistor T5. The switching thin film transistor T2 may be turned on in response to a scan signal Sn transferred through the scan line SL and may perform a switching operation of transferring a data signal Dm transferred through the data line DL to the driving source electrode S1 of the driving thin film transistor T1.

A compensation gate electrode G3 of the compensation thin film transistor T3 may be connected to the scan line SL, a compensation source electrode S3 of the compensation thin film transistor T3 may be connected to the driving drain electrode D1 of the driving thin film transistor T1 and connected to the pixel electrode of the OLED through the emission control thin film transistor T6, and a compensation drain electrode D3 of the compensation thin film transistor T3 may be connected to the first storage capacitor plate CE1 of the storage capacitor Cst, a first initialization drain electrode D4 of the first initialization thin film transistor T4, and the driving gate electrode G1 of the driving thin film transistor T1. The compensation thin film transistor T3 may be turned on in response to a scan signal Sn transferred through the scan line SL and diode-connects the driving thin film transistor T1 by electrically connecting the driving gate electrode G1 with the driving drain electrode D1 of the driving thin film transistor T1.

A first initialization gate electrode G4 of the first initialization thin film transistor T4 may be connected to the previous scan line SL-1, a first initialization source electrode S4 of the first initialization thin film transistor T4 may be connected to a second initialization drain electrode D7 of the second initialization thin film transistor T7 and the initialization voltage line VL, and a first initialization drain electrode D4 of the first initialization thin film transistor T4 may be connected to the first storage capacitor plate CE1 of the storage capacitor Cst, the compensation drain electrode D3 of the compensation thin film transistor T3, and the driving gate electrode G1 of the driving thin film transistor T1. The first initialization thin film transistor T4 may be turned on in response to a previous scan signal Sn-1 transferred through the previous scan line SL-1 and may perform an initialization operation of initializing a voltage of the driving gate electrode G1 of the driving thin film transistor T1 by transferring the initialization voltage Vint to the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be electrically connected to a second initialization source electrode S7 of the second initialization thin film transistor T7 and the pixel electrode of the OLED.

The operation control thin film transistor T5 and the emission control thin film transistor T6 may be simultaneously turned on in response to an emission control signal En transferred through the emission control line EL to allow the driving voltage ELVDD to be transferred to the OLED and allow the driving current $I_{OLED}$ to flow through the OLED.

A second initialization gate electrode G7 of the second initialization thin film transistor T7 may be connected to the previous scan line SL-1, a second initialization source electrode S7 of the second initialization thin film transistor T7 may be connected to the emission control drain electrode D6 of the emission control thin film transistor T6 and the pixel electrode of the OLED, and a second initialization drain electrode D7 of the second initialization thin film transistor T7 may be connected to the first initialization source electrode S4 of the first initialization thin film transistor T4 and the initialization voltage line VL. The second initialization thin film transistor T7 may be turned on in response to a previous scan signal Sn-1 transferred through the previous scan line SL-1 to initialize the pixel electrode of the OLED.

In an implementation, as illustrated in FIG. 5, the first initialization thin film transistor T4 and the second initialization thin film transistor T7 may be connected to the previous scan line SL-1. In an implementation, the first initialization thin film transistor T4 may be connected to the previous scan line SL-1 and driven in response to a previous scan signal Sn-1, and the second initialization thin film transistor T7 may be connected to a separate signal line (e.g. the next scan line) and driven in response to a signal transferred through the signal line.

A second storage capacitor plate CE2 of the storage capacitor Cst may be connected to the driving voltage line PL, and the opposite electrode of the OLED may be connected to a common voltage ELVSS. Accordingly, the OLED may display an image by receiving the driving current $I_{OLED}$ from the driving thin film transistor T1 and emitting light.

In an implementation, as illustrated in FIG. 5, each of the compensation thin film transistor T3 and the initialization thin film transistor T4 may include a dual gate electrode. In an implementation, each of the compensation thin film transistor T3 and the initialization thin film transistor T4 may include one gate electrode.

Figure 6A:
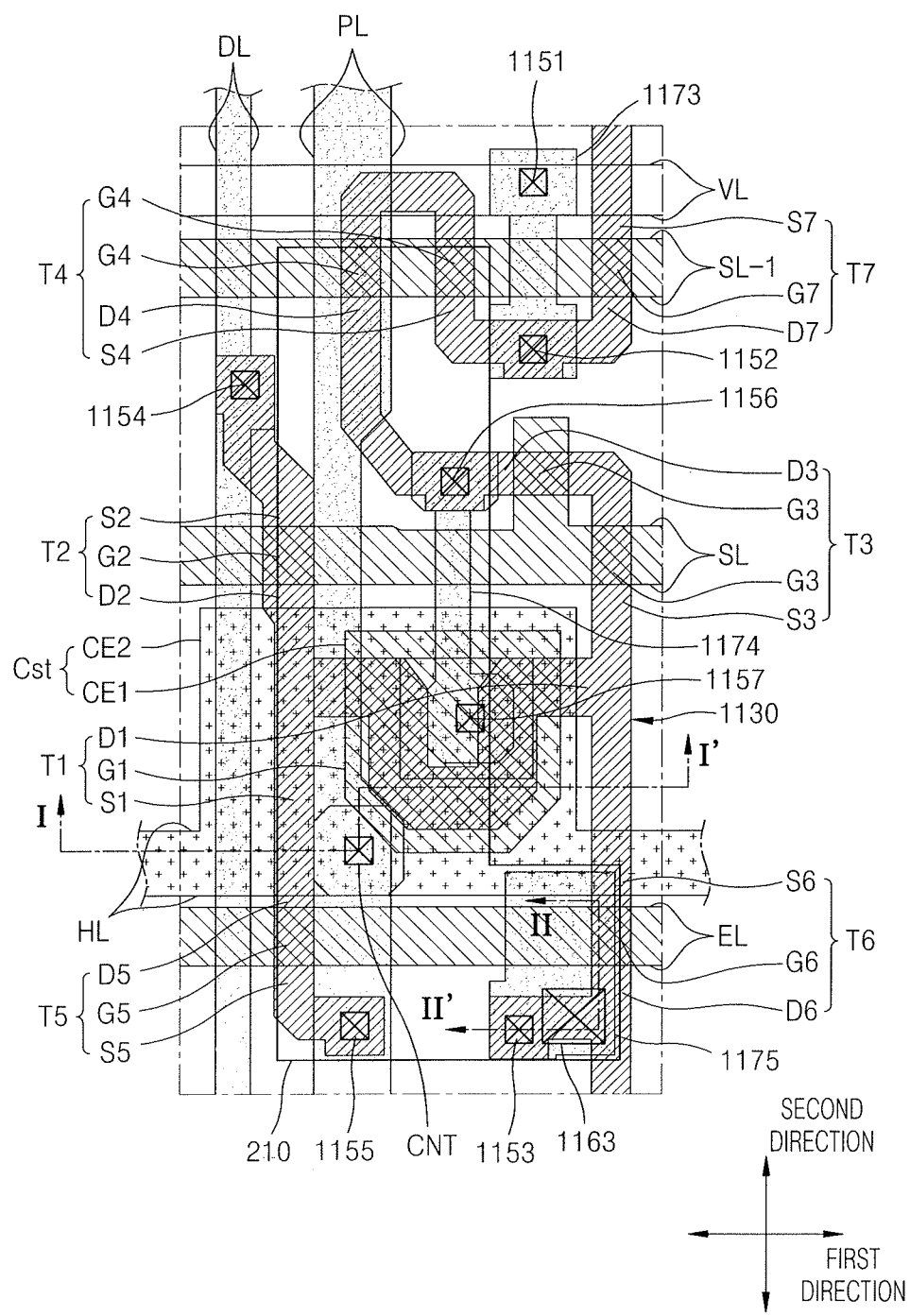
FIG. 6A illustrates a plan view of a pixel circuit of one of the pixels of a display panel according to an embodiment.

FIG. 6A illustrates a plan view of a pixel circuit of one of the pixels of a display panel according to an embodiment.

Referring to FIG. 6A, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged along or on a semiconductor layer 1130. The semiconductor layer 1130 may be arranged over or on a substrate that includes a buffer layer including an inorganic insulating material thereon.

Some regions of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. For example, it may be understood that semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to each other and bent in various shapes.

The semiconductor layer 1130 may include a channel region, a source region and a drain region on two opposite sides of the channel region. The source region and the drain region may be understood as a source electrode and a drain electrode of the relevant thin film transistor. Hereinafter, for convenience of description, the source region and the drain region are respectively called a source electrode and a drain electrode.

The driving thin film transistor T1 may include the driving gate electrode G1 that overlaps a driving channel region, and the driving source electrode S1 and the driving drain electrode D1 on two opposite sides of the driving channel region. The driving channel region that overlaps the driving gate electrode G1 may form a long channel length inside a narrow space by having a bent shape such as an omega shape. In the case where the length of the driving channel region is long, since a driving range of a gate voltage is widened, a gray scale of light emitted from the OLED may be more elaborately controlled and display quality may be improved.

The switching thin film transistor T2 may include the switching gate electrode G2 that overlaps a switching channel region, and the switching source electrode S2 and the switching drain electrode D2 on two opposite sides of the switching channel region. The switching drain electrode D2 may be connected to the driving source electrode S1.

The compensation thin film transistor T3 may be a dual thin film transistor and may include compensation gate electrodes G3 that respectively overlap two compensation channel regions, and include the compensation source electrode S3 and the compensation drain electrode D3 arranged on two opposite sides of the compensation channel region. The compensation thin film transistor T3 may be connected to the driving gate electrode G1 of the driving thin film transistor T1 through a node connection line 1174 described below.

The first initialization thin film transistor T4 may be a dual thin film transistor and may include first initialization gate electrodes G4 that respectively overlap two first initialization channel regions and include the first initialization source electrode S4 and the first initialization drain electrode D4 arranged on two opposite sides of the first initialization channel region.

The operation control thin film transistor T5 may include the operation control gate electrode G5 that overlaps an operation control channel region, and the operation control source electrode S5 and the operation control drain electrode D5 arranged on two opposite sides of the operation control channel region. The operation control drain electrode D5 may be connected to the driving source electrode S1.

The emission control thin film transistor T6 may include the emission control gate electrode G6 that overlaps an emission control channel region, and the emission control source electrode S6 and the emission control drain electrode D6 arranged on two opposite sides of the emission control channel region. The emission control source electrode S6 may be connected to the driving drain electrode D1.

The second initialization thin film transistor T7 may include the second initialization gate electrode G7 that overlaps a second initialization channel region, and the second initialization source electrode S7 and the second initialization drain electrode D7 arranged on two opposite sides of the second initialization channel region.

The above-described thin film transistors may be connected to the signal lines SL, SL-1, EL, and DL, the initialization voltage line VL, and the driving voltage line PL.

The scan line SL, the previous scan line SL-1, the emission control line EL, and the driving gate electrode G1 may be arranged over the semiconductor layer 1130 with an insulating layer(s) therebetween.

The scan line SL may extend in the first direction. Some regions of the scan line SL may correspond to the switching and compensation gate electrodes G2 and G3. For example, regions of the scan line SL that overlap the channel regions respectively of the switching and compensation thin film transistors T2 and T3 may be the switching and compensation gate electrodes G2 and G3.

The previous scan line SL-1 may extend in the first direction and some regions of the previous scan line SL-1 may correspond to the first and second initialization gate electrodes G4 and G7. For example, regions of the previous scan line SL-1 that overlap the channel regions of the first and second initialization thin film transistors T4 and T7 may be the first and second initialization gate electrodes G4 and G7, respectively.

The emission control line EL may extend in the first direction. Some regions of the emission control line EL may correspond to the operation control and emission control gate electrodes G5 and G6. For example, regions of the emission control line EL that overlap the channel regions of the operation control and the emission control thin film transistors T6 and T7 may be the operation control and emission control gate electrodes G5 and G6, respectively.

The driving gate electrode G1 is a floating electrode and may be electrically connected with the compensation thin film transistor T3 through the above-described node connection line 1174.

An electrode voltage line HL may be arranged over or on the scan line SL, the previous scan line SL-1, the emission control line EL, and the driving gate electrode G1 with an insulating layer(s) therebetween.

The electrode voltage line HL may extend in the first direction to intersect with the data line DL and the driving voltage line PL. A portion of the electrode voltage line HL may cover at least a portion of the driving gate electrode G1 and form the storage capacitor Cst with the driving gate electrode G1. For example, the driving gate electrode G1 may serve as the first storage capacitor plate CE1 of the storage capacitor Cst, and a portion of the electrode voltage line HL may serve as the second storage capacitor plate CE2 of the storage capacitor Cst.

The second storage capacitor plate CE2 of the storage capacitor Cst may be electrically connected to the driving voltage line PL. With regard to this, the electrode voltage line HL may be connected to the driving voltage line PL arranged over the electrode voltage line HL through a contact hole CNT. Therefore, the electrode voltage line HL may have the same voltage level (constant voltage) as the driving voltage line PL. For example, the electrode voltage line HL may have a constant voltage of +5V. The electrode voltage line HL may be understood as a transverse driving voltage line.

The driving voltage line PL may extend in a second direction and the electrode voltage line HL electrically connected to the driving voltage line PL may extend in the first direction that intersects with the second direction, and a plurality of driving voltage lines PL and the electrode voltage lines HL may constitute a mesh structure in the display area DA.

The data line DL, the driving voltage line PL, an initialization connection line 1173, and the node connection line 1174 may be arranged over the electrode voltage line HL with an insulating layer(s) therebetween.

The data line DL may extend in the second direction and may be connected to the switching source electrode S2 of the switching thin film transistor T2 through a contact hole

1154. A portion of the data line DL may be understood as the switching source electrode S2.

The driving voltage line PL may extend in the second direction and may be connected to the electrode voltage line HL through the contact hole CNT as described above. Also, the driving voltage line PL may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and another end of the initialization connection line 1173 may be connected to the initialization voltage line VL, which will be described below, through a contact hole 1151.

One end of the node connection line 1174 may be connected to the compensation drain electrode D3 through a contact hole 1156, and another end of the node connection line 1174 may be connected to the driving gate electrode G1 through a contact hole 1157.

The initialization voltage line VL may be arranged over the data line DL, the driving voltage line PL, the initialization connection line 1173, and the node connection line 1174 with an insulating layer(s) therebetween.

The initialization voltage line VL may extend in the first direction. The initialization voltage line VL may be connected to the first and second initialization thin film transistors T4 and T7 through the initialization connection line 1173. The initialization voltage line VL may have a constant voltage (e.g. −2V).

The initialization voltage line VL may be on the same layer as a pixel electrode 210 of the OLED (see FIG. 5) and may include the same material as the pixel electrode 210. The pixel electrode 210 may be connected to the emission control thin film transistor T6. The pixel electrode 210 may be connected to a connection metal 1175 through a contact hole 1163, and the connection metal 1175 may be connected to the emission control drain electrode D6 through a contact hole 1153.

In an implementation, as illustrated in FIG. 6A, the initialization voltage line VL may be on the same layer as that of the pixel electrode 210. In an implementation, the initialization voltage line VL may be on the same layer as that of the electrode voltage line HL.

In an implementation, as illustrated in FIGS. 5 and 6A, the pixel circuit PC may include seven thin film transistors and one storage capacitor. In an implementation, the number of thin film transistors and the number of storage capacitors may be variously modified depending on a design of the pixel circuit PC.

Figure 6B:
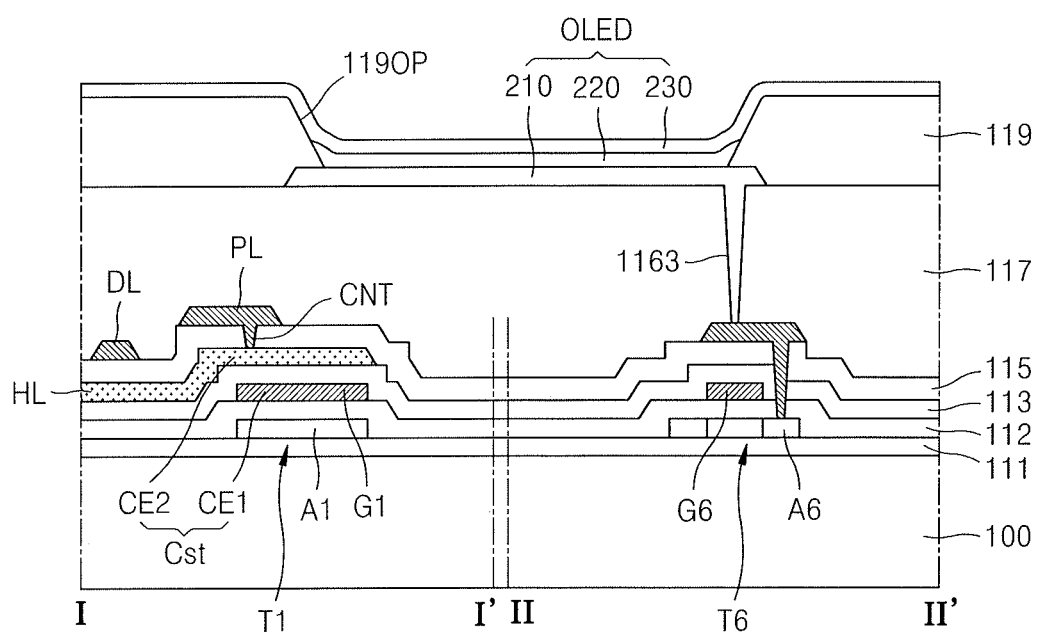
FIG. 6B illustrates a cross-sectional view of an organic light-emitting diode arranged in a cross-sectional view taken along lines I-I' and II-II' of FIG. 6A.

Hereinafter, a stacked structure of elements included in a display panel according to an embodiment is described with reference to FIG. 6B. FIG. 6B illustrates a cross-sectional view of an OLED arranged in a cross-sectional view taken along lines I-I' and II-II' of FIG. 6A.

The substrate 100 may include glass or a polymer resin. The polymer resin may include, e.g., polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 including a polymer resin may be flexible, rollable, or bendable. The substrate 100 may have a multi-layered structure including a layer including the above-described polymer resin and an inorganic layer (not shown).

A buffer layer 111 may be on the substrate 100 and may help reduce or block penetration of foreign substances, moisture, or external air from below the substrate 100 and provide a flat surface on the substrate 100. The buffer layer 111 may include an inorganic material such as an oxide or a nitride, or an organic material, or an organic/inorganic composite material. The buffer layer 111 may have a single-layered or multi-layered structure of an inorganic material and an organic material. In an implementation, a barrier layer to block penetration of external air may be between the substrate 100 and the buffer layer 111.

Each of semiconductor layers A1 and A6 may include amorphous silicon or polycrystalline silicon. In an implementation, the semiconductor layers A1 and A6 may include an oxide including at least one of In, Ga, Sn, Zr, V, Hf, Cd, Ge, Cr, Ti, and Zn. Each of the semiconductor layers A1 and A6 may include a channel region and a source region and a drain region doped with impurities.

The gate electrodes G1 and G6 may be respectively on the semiconductor layers A1 and A6 with a first gate insulating layer 112 therebetween. Each of the gate electrodes G1 and G6 may include Mo, Al, Cu and Ti, and include a single layer or a multi-layer. In an embodiment, each of the gate electrodes G1 and G6 may include a single layer of Mo. The scan line SL (see FIG. 6A), the previous scan line SL-1, and the emission control line EL may be on the same layer as that of the gate electrodes G1 and G6. For example, the gate electrodes G1 and G6, the scan line SL (see FIG. 6A), the previous scan line SL-1, and the emission control line EL may be on the first gate insulating layer 112.

The first gate insulating layer 112 may include, e.g., one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A second gate insulating layer 113 may cover the gate electrodes G1 and G6. The second gate insulating layer 113 may include, e.g., one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The first storage capacitor plate CE1 of the storage capacitor Cst may be formed as one body with the gate electrode G1 of the driving thin film transistor T1. For example, the gate electrode G1 of the driving thin film transistor T1 may also serve as the first storage capacitor plate CE1 of the storage capacitor Cst.

The second storage capacitor plate CE2 of the storage capacitor Cst may overlap the first storage capacitor plate CE1 with the second gate insulating layer 113 therebetween. In this case, the second gate insulating layer 113 may serve as a dielectric layer of the storage capacitor Cst. The second storage capacitor plate CE2 may include a conductive material such as Mo, Al, Cu and Ti and may include a single or multi-layer including the above-mentioned material. In an implementation, the second storage capacitor plate CE2 may include a single layer of Mo or a multi-layer of Mo/Al/Mo.

In an implementation, as shown in the drawing figures, the storage capacitor Cst may overlap the driving thin film transistor T1. In an implementation, the storage capacitor Cst may not overlap the driving thin film transistor T1. Various modifications may be made.

The second storage capacitor plate CE2 may serve as the electrode voltage line HL. For example, a portion of the electrode voltage line HL may serve as the second storage capacitor plate CE2 of the storage capacitor Cst.

An interlayer insulating layer 115 may cover the second storage capacitor plate CE2. The interlayer insulating layer 115 may include, e.g., one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The data line DL, the driving voltage line PL, and the connection metal 1175 may be on the interlayer insulating layer 115. The data line DL, the driving voltage line PL, and the connection metal 1175 may include a conductive material such as Mo, Al, Cu and Ti and may include a single or multi-layer including the above-mentioned material. In an implementation, the data line DL, the driving voltage line PL, and the connection metal 1175 may have a multi-layered structure of Ti/Al/Ti.

The second storage capacitor plate CE2 of the storage capacitor Cst may be connected to the driving voltage line PL through a contact hole CNT in the interlayer insulating layer 115. This means that the electrode voltage line HL may be connected to the driving voltage line PL through the contact hole CNT. Therefore, the electrode voltage line HL may have the same voltage level (constant voltage) as that of the driving voltage line PL.

The connection metal 1175 may be connected to the semiconductor layer A6 of the emission control thin film transistor T6 through the contact hole 1153 that passes through the interlayer insulating layer 115, the second gate insulating layer 113, and the first gate insulating layer 112. The emission control thin film transistor T6 may be electrically connected to the pixel electrode 210 of the OLED through the connection metal 1175.

A planarization layer 117 may be on the data line DL, the driving voltage line PL, and the connection metal 1175. The OLED may be on the planarization layer 117.

The planarization layer 117 may have a flat top surface such that the pixel electrode 210 is formed flat. The planarization layer 117 may include a single or multi-layer including an organic material. The planarization layer 117 may include, e.g., a general-purpose polymer such as benzocyclobutene (BCB), polyimide, hexamethyldisiloxane (HMDSO), polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include, e.g., one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In the case where the planarization layer 117 includes an inorganic material, chemical planarization polishing may be performed when needed. In an implementation, the planarization layer 117 may include both an organic material and an inorganic material.

A contact hole 1163 that exposes the connection metal 1175 may be in the planarization layer 117, and the pixel electrode 210 may be connected to the connection metal 1175 through the contact hole 1163.

The pixel electrode 210 may include a (semi) transparent electrode or a reflective electrode. In an implementation, the pixel electrode 210 may include a reflective layer including Ag, Mg, Al, Pt, Pd, Au, Ni, Nd, Ir, Cr, or a compound thereof, and a transparent or semi-transparent electrode layer on the reflective layer. The transparent or semi-transparent electrode layer may include at least one of indium tin oxide (ITO), zinc oxide (IZO), zinc oxide (ZnO), indium oxide ($In_2O_3$), indium gallium oxide (IGO), and aluminum zinc oxide (AZO). In an implementation, the pixel electrode 210 may have a stacked structure of ITO/Ag/ITO.

A pixel-defining layer 119 may be on the planarization layer 117. The pixel-defining layer 119 may define an emission area of a pixel by including an opening 119OP that exposes a central portion of the pixel electrode 210. Also, the pixel-defining layer 119 may prevent an arc, etc. from occurring at an edge of the pixel electrode 210 by increasing a distance between the edge of the pixel electrode 210 and an opposite electrode 230 over the pixel electrode 210. The pixel-defining layer 119 may include an organic insulating material such as polyimide, polyamide, an acrylic resin, BCB, polyimide, HMDSO, and a phenolic resin and may be formed by spin coating, etc.

An intermediate layer 220 of the OLED may include an organic emission layer. The organic emission layer may include an organic material including a fluorescent or phosphorescent material which emits red, green, blue, or white light. The organic emission layer may include a low molecular or polymer organic material. A functional layer such as a hole transport layer (HTL), a hole injection layer (HIL), an electron transport layer (ETL), and an electron injection layer (EIL) may be selectively further arranged under and on the organic emission layer. The intermediate layer 220 may correspond to each of a plurality of pixel electrodes 210. In an implementation, the intermediate layer 220 may include a layer that is one body over the plurality of pixel electrodes 210. Various modifications may be made.

The opposite electrode 230 may include a light-transmissive electrode or a reflective electrode. In an implementation, the opposite electrode 230 may include a transparent or semi-transparent electrode and may include a metal thin film having a small work function and including Li, Ca, LiF/Ca, LiF/Al, Al, Ag, Mg, and a compound thereof. In an implementation, a transparent conductive oxide (TCO) layer such as ITO, IZO, ZnO, or $In_2O_3$ may be further arranged on the metal thin film. The opposite electrode 230 may be on the display area DA and a peripheral area PA and on the intermediate layer 220 and the pixel-defining layer 119. The opposite electrode 230 may be provided as one body over a plurality of OLEDs and may correspond to the plurality of pixel electrodes 210.

In the case where the pixel electrode 210 includes a reflective electrode and the opposite electrode 230 includes a light-transmissive electrode, light emitted from the intermediate layer 220 may be emitted toward the opposite electrode 230 and a display device may be a top-emission display device. In the case where the pixel electrode 210 includes a transparent or semi-transparent electrode and the opposite electrode 230 includes a reflective electrode, light emitted from the intermediate layer 220 may be emitted toward the substrate 100 and a display device may be a bottom-emission display device. In an implementation, the display device may be a dual-emission display device which emits light in two directions of a top direction and a bottom direction.

Figure 7:
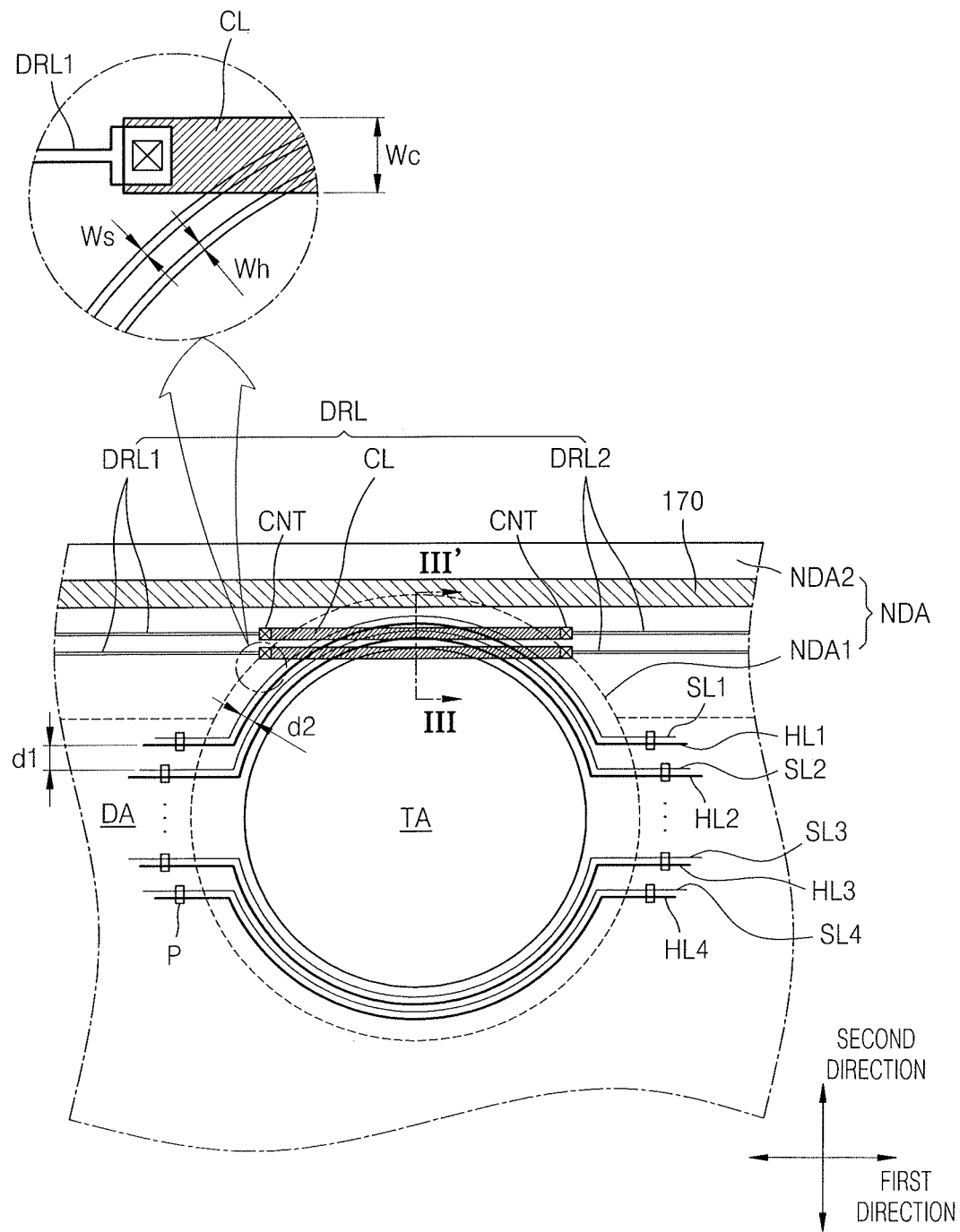
FIG. 7 illustrates a plan view of wirings neighboring a transmissive area according to an embodiment.
Figure 8:
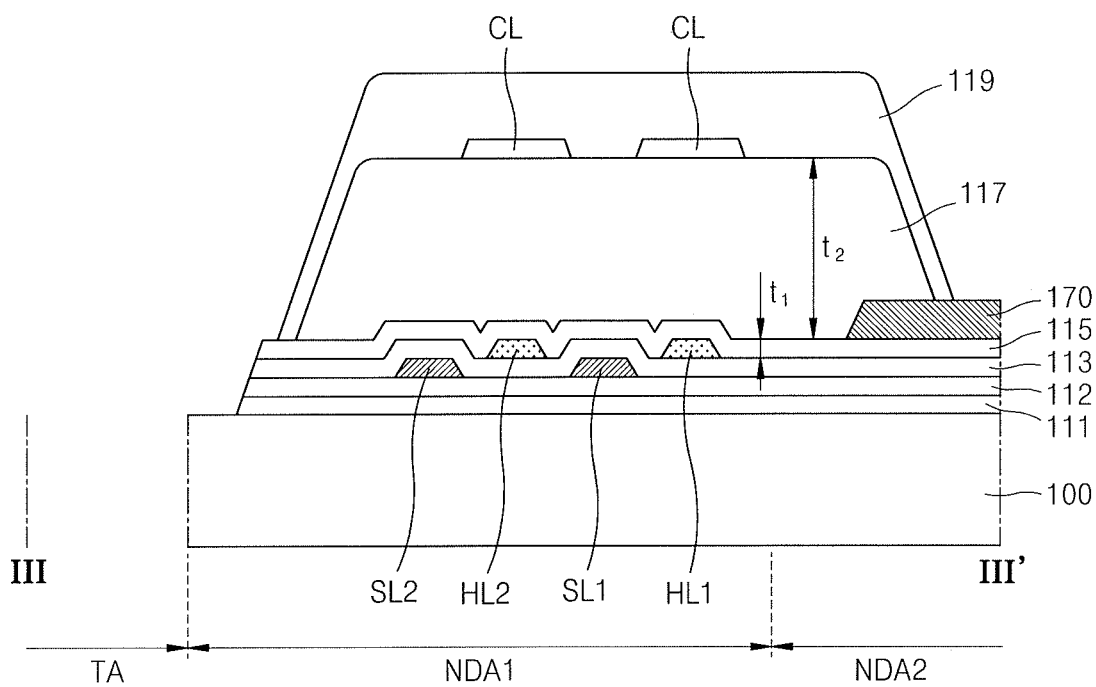
FIG. 8 illustrates a cross-sectional view of wirings neighboring a transmissive area taken along line III-III' of FIG. 7.

FIG. 7 illustrates a plan view of wirings adjacent to the transmissive area TA according to an embodiment, and FIG. 8 illustrates a cross-sectional view of wirings adjacent to the transmissive area TA taken along line III-III' of FIG. 7.

First, referring to FIG. 7, the transmissive area TA may be located at an edge of the display area DA, and a portion of the first non-display area NDA1 surrounding the transmissive area TA may be connected to the second non-display area NDA2.

In a display panel according to the present embodiment, scan lines SL1 and SL2 and electrode voltage lines HL1 and HL2 that detour along or around an edge of the transmissive area TA may be in the first non-display area NDA1 around the transmissive area TA. A connection line CL may overlap at least some of the scan lines SL1 and SL2 and the electrode voltage lines HL1 and HL2 in the first non-display area NDA1.

In an implementation, the connection line CL may be on the planarization layer 117 on which the pixel electrode 210 (see FIG. 6B) is arranged and may include a straight line portion extending in the first direction.

The connection line CL may be connected to a first line and a second line respectively through contact holes CNT and thus may electrically connect the first line to the second line.

In the present embodiment, the first line and the second line may respectively correspond to a first driving line DRL1 and a second driving line DRL2. The first driving line DRL1 may be connected to the first scan driving circuit 110 and may extend along the second non-display area NDA2. The second driving line DRL2 may be connected to the second scan driving circuit 120 and may extend along the second non-display area NDA2.

The connection line CL may be on a layer different from those of the first driving line DRL1 and the second driving line DRL2 and may be connected to the first driving line DRL1 and the second driving line DRL2 through a contact hole CNT. The first driving line DRL1, the connection line CL, and the second driving line DRL2 are collectively referred to as driving lines DRL. As described above, the driving line DRL may connect the first scan driving circuit 110 to the second scan driving circuit 120 in the non-display area NDA and may be provided as a plurality of driving lines DRL. In an implementation, as illustrated in the drawings, two driving lines DRL may be present. In an implementation, the driving line DRL may be provided as two to ten driving lines DRL each transferring a different signal or voltage.

In an implementation, the first driving line DRL1 and the second driving line DRL2 may be on the interlayer insulating layer 115 on which the data line DL (see FIG. 6B) is arranged. In an implementation, the first driving line DRL1 and the second driving line DRL2 may be on the second gate insulating layer 113, or the first driving line DRL1 and the second driving line DRL2 may be respectively arranged on different layers. Various modifications may be made.

In an implementation, some of the first driving lines DRL1 may be on the interlayer insulating layer 115, and the rest of the first driving lines DRL1 may be on the second gate insulating layer 113. In an implementation, some of the second driving lines DRL2 may be on the interlayer insulating layer 115, and the rest of the second driving lines DRL2 may be on the second gate insulating layer 113.

A portion of the transmissive area TA may be surrounded by the display area DA, a plurality of pixels P may be arranged around the transmissive area TA, and wirings configured to transfer an electric signal or voltage to the plurality of pixels may detour around the transmissive area TA.

The scan lines SL1, SL2, SL3, and SL4 and the electrode voltage lines HL1, HL2, HL3, and HL4 may extend in the first direction, and the driving voltage lines and the data lines may extend in the second direction that intersects with the scan lines SL1. SL2, SL3, SL4, and SL5.

Some scan lines SL1, SL2, SL3, and SL4 may detour around the transmissive area TA. For example, the first and second scan lines SL1 and SL2 may be curved along one (e.g., an upper) edge of the transmissive area TA, and the third and fourth scan lines SL3 and SL4 may be curved along another (e.g., a lower) edge of the transmissive area TA. Each of the scan lines SL1, SL2, SL3, and SL4 may include a portion that extends along the first direction in the display area DA and a portion (or curved portion) that detours an edge of the transmissive area TA in the first non-display area NDA1. Pixels P located on left and right of the transmissive area TA may be electrically connected to the scan lines SL1, SL2, SL3, and SL4 that detour the transmissive area TA.

The electrode voltage lines HL1, HL2, HL3, and HL4 may be on a layer different from that of the scan lines SL1, SL2, SL3, and SL4 and may extend in the first direction. Some electrode voltage lines HL1, HL2, HL3, and HL4 may detour around the transmissive area TA. For example, the first electrode voltage line HL1 and the second electrode voltage line HL2 may include a portion that extends in the first direction and a portion that detours around a (e.g., top) side of the transmissive area TA. The third electrode voltage line HL3 and the four electrode voltage line HL4 may include a portion that extends in the first direction and a portion that detours around a (e.g., bottom) side of the transmissive area TA. In an implementation, the detouring portion of the second electrode voltage line HL2 and the detouring portion of the third electrode voltage line HL3 may be connected to each other to have a ring shape.

In an implementation, the scan lines SL1, SL2, SL3, and SL4 may be on the first gate insulating layer 112 on which the gate electrodes G1 and G2 (see FIG. 6B) are arranged, and the electrode voltage lines HL1, HL2, HL3, and HL4 may be on the second gate insulating layer 113 on which the second storage capacitor plate CE2 (see FIG. 6B) of the storage capacitor Cst is arranged. In an implementation, the detouring portions of the scan lines SL1, SL2, SL3, and SL4 may not overlap the detouring portions of the electrode voltage lines HL1, HL2, HL3, and HL4. Therefore, parasitic capacitances that may occur between the scan lines SL1, SL2, SL3, and SL4 and the electrode voltage lines HL1, HL2, HL3, and HL4 may be minimized.

In an implementation, the connection line CL may overlap the scan lines SL1 and SL2 and the electrode voltage lines HL1 and HL2 that detour the top side of the transmissive area TA. The connection line CL may be on the planarization layer 117 on which the pixel electrode 210 (see FIG. 6B) is arranged.

In an implementation, as illustrated in the drawings, the number of scan lines SL1 and SL2 that detour the top side of the transmissive area TA may be two. In an implementation, the number of scan lines may be two or more, e.g., tens of scan lines may be provided. In an implementation, an interval d2 between the scan lines SL1 and SL2 that are on or around the transmissive area TA may be less than an interval d1 between the scan lines SL1 and SL2 that are in the display area DA. Narrowing of an interval between the scan lines SL1 and SL2 may mean that an insulating layer covering the scan lines SL1 and SL2 may be severely curved.

Referring to FIG. 8, the first scan line SL1 and the second scan line SL2 may be on the first gate insulating layer 112 and may be covered by the second gate insulating layer 113.

The first electrode voltage line HL1 and the second electrode voltage line HL2 may be on the second gate insulating layer 113 and may be covered by the interlayer insulating layer 115.

The second gate insulating layer 113 and the interlayer insulating layer 115 may include, e.g., an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). Due to its characteristic, a top surface of the second gate insulating layer 113 and the interlayer insulating layer 115 may be curved according to the arrangement of the scan lines SL1 and SL2 and the electrode voltage lines HL1 and HL2.

The second power supply line 170 may be on the interlayer insulating layer 115, and the planarization layer 117 may cover one end of the second power supply line 170.

In the present embodiment, the connection line CL that constitutes a portion of the driving line DRL may not be on the interlayer insulating layer 115 that forms a curved surface and may be on the planarization layer 117 that provides a flat top surface. Therefore, the occurrence of a defect of the driving line DRL due to a layer thereunder may be minimized.

Figure 9:
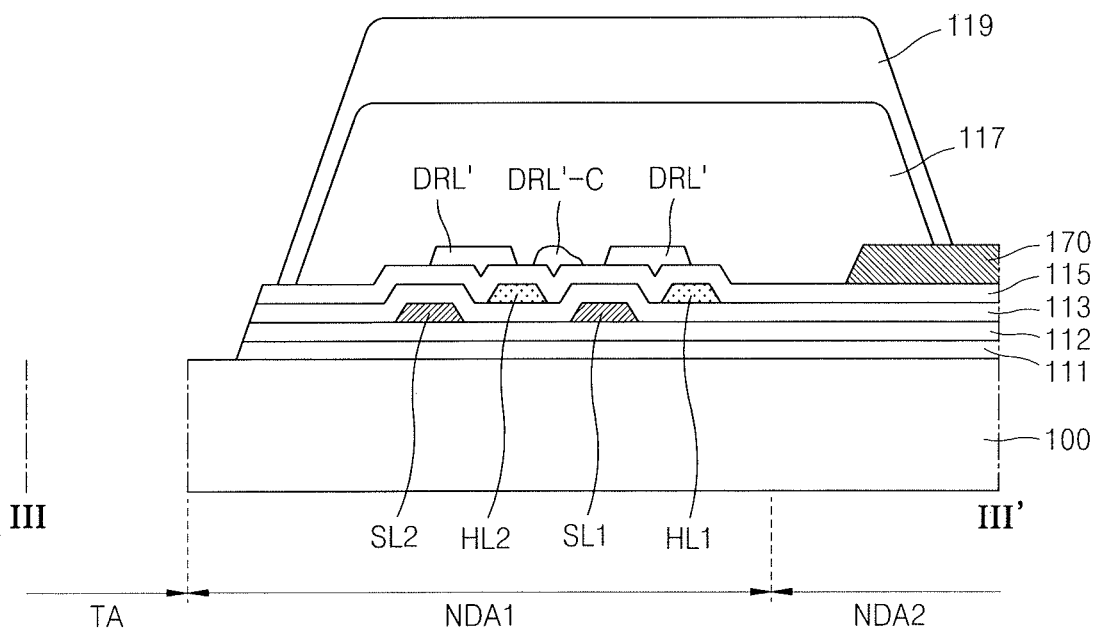
FIG. 9 illustrates a cross-sectional view of a comparative example for comparison with an embodiment.

Referring to FIG. 9, which is a comparative example, a driving line DRL' may be on the interlayer insulating layer 115 that forms a curved top surface. To form the driving line DRL', a method of forming a conductive layer for forming the driving line DRL' on the entire surface of the substrate 100 and then patterning the conductive layer through a photoresist process and an etching process may be used.

In this case, when a layer under the conductive layer constitutes a deep valley, a portion of the conductive layer that should be removed during the etching process may not be removed from the valley portion and a remnant DRL'-C may remain. The remnant DRL'-C may cause an undesirable short-circuit between the driving lines DRL'.

Therefore, the above defect may be reduced and/or prevented by forming a portion of the driving line DRL by using the connection line CL on the planarization layer 117 in an area where the driving line DRL, the scan lines SL1 and SL2 and the electrode voltage lines HL1 and HL2 overlap one another.

The planarization layer 117 may provide a flat top surface, and a defect may not occur when the connection lines CL arranged on the planarization layer 117 are patterned. As described above, the planarization layer 117 may include an organic material or an inorganic material. In the case where the planarization layer 117 includes an organic material, a top surface of the planarization layer 117 may be provided flat due to its characteristic. In the case where the planarization layer 117 includes an inorganic material, polishing may be performed so as to provide a flat top surface, or a thickness t2 of the planarization layer 117 may be formed greater than a thickness t1 of the interlayer insulating layer 115. Winding generated by lower members may be reduced by forming a thickness of the planarization layer 117 large.

Referring to FIG. 7, the connection line CL may include a straight line portion that extends in the first direction. In an implementation, the scan lines SL1 and SL2 and the electrode voltage lines HL1 and HL2 that overlap the connection line CL may detour around the transmissive area TA and thus include a curved portion. In an implementation, a width Wc of the connection line CL may be greater than a width Ws of each of the scan lines SL1 and SL2 and a width Wh of each of the electrode voltage lines HL1 and HL2.

The connection line CL may be in the non-display area NDA between the transmissive area TA and the second power supply line 170. One end of the connection line CL may be connected to the first driving line DRL1 through a contact hole CNT, and the other end of the connection line CL may be connected to the second driving line DRL2 through a contact hole CNT.

In an implementation, the first driving line DRL1 and the second driving line DRL2 may be on the interlayer insulating layer 115 on which the second power supply line 170 is arranged.

Figure 10:
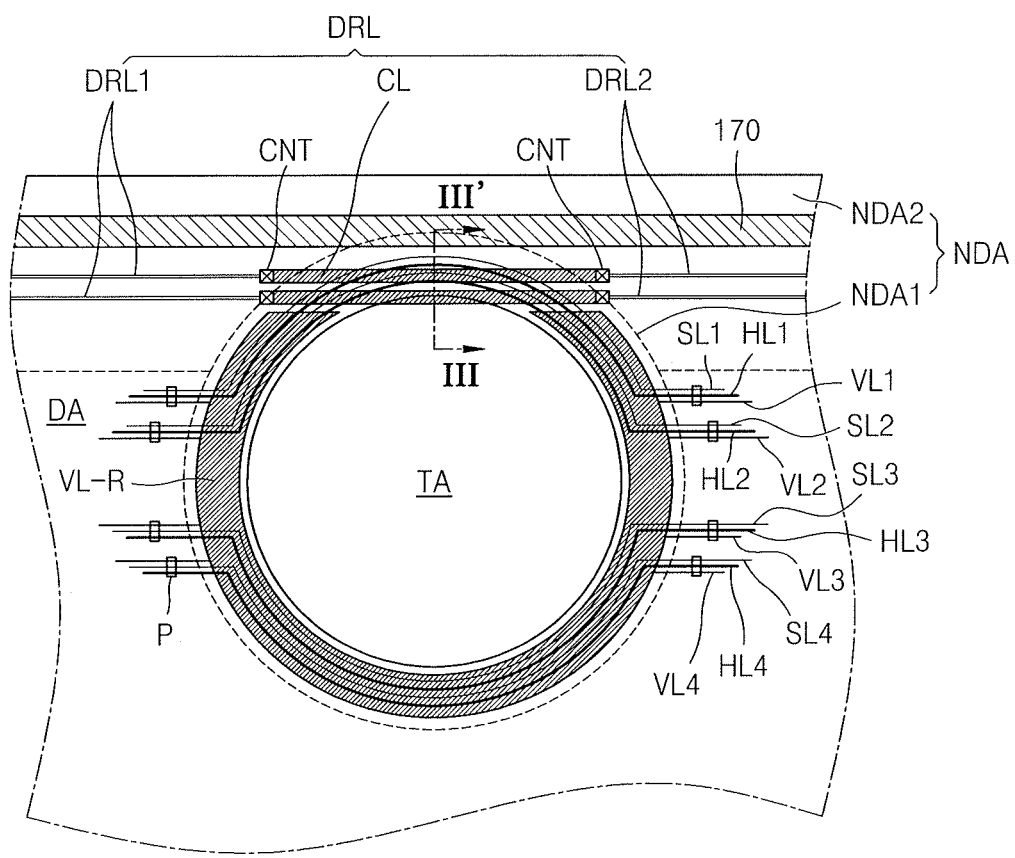
FIG. 10 illustrates a plan view of a display panel of another embodiment.

FIG. 10 illustrates a plan view of a display panel according to another embodiment. In FIG. 10, same reference numerals as those of FIG. 7 are used for same elements and repeated descriptions thereof are omitted.

Referring to FIG. 10, in the display panel according to an embodiment, the scan lines SL1 and SL2 and the electrode voltage lines HL1 and HL2 that detour along an edge of the transmissive area TA may be in the first non-display area NDA1 over or around the transmissive area TA, and the connection line CL that overlaps at least a portion of the scan lines SL1 and SL2 and the electrode voltage lines HL1 and HL2 may be in the first non-display area NDA1 over or around the transmissive area TA.

The connection line CL may be on the planarization layer 117 on which the pixel electrode 210 (see FIG. 6B) is arranged and may include a straight line portion that extends in the first direction.

The detouring scan lines SL1 and SL2 and the detouring electrode voltage lines HL1 and HL2 may include a curved portion, and the scan lines SL1 and SL2 and the electrode voltage lines HL1 and HL2 may be on different layers.

In the present embodiment, an electrode layer VL-R having a ring shape whose one side is open and partially surrounding the transmissive area TA may be in the first non-display area NDA1. The electrode layer VL-R may be connected to initialization voltage lines VL1, VL2, VL3, and VL4 and thus may have the same voltage level (e.g. a constant voltage) as that of the initialization voltage lines VL1, VL2, VL3, and VL4. The electrode layer VL-R may overlap wirings arranged in the first non-display area NDA1.

The electrode layer VL-R may be on the planarization layer 117 on which the connection line CL is arranged and may be spaced apart from the connection line CL. The electrode layer VL-R may cover detouring wirings in the first non-display area NDA1, and the electrode layer VL-R may cancel coupling that may occur between the detouring wirings.

Up to now, description has been made to the case where the transmissive area TA is arranged at the edge of the display area DA, and the display area DA partially surrounds the transmissive area TA.

Figure 11:
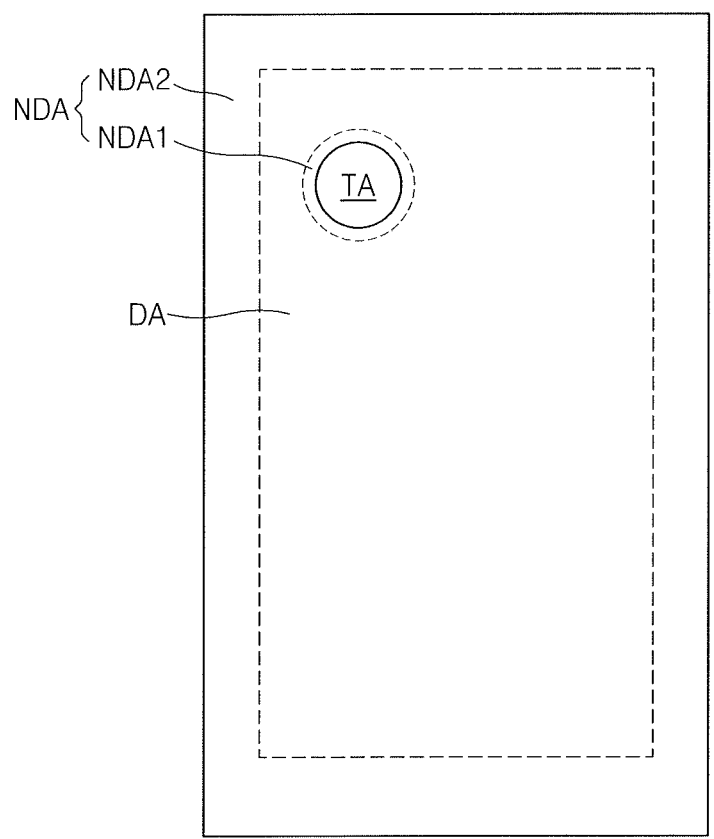
FIG. 11 illustrates a plan view of a display panel of another embodiment.

The embodiments are also applicable to the case where the transmissive area TA is arranged inside the display area DA and thus the transmissive area TA is entirely surrounded by the display area DA as in FIG. 11.

Figure 12A:
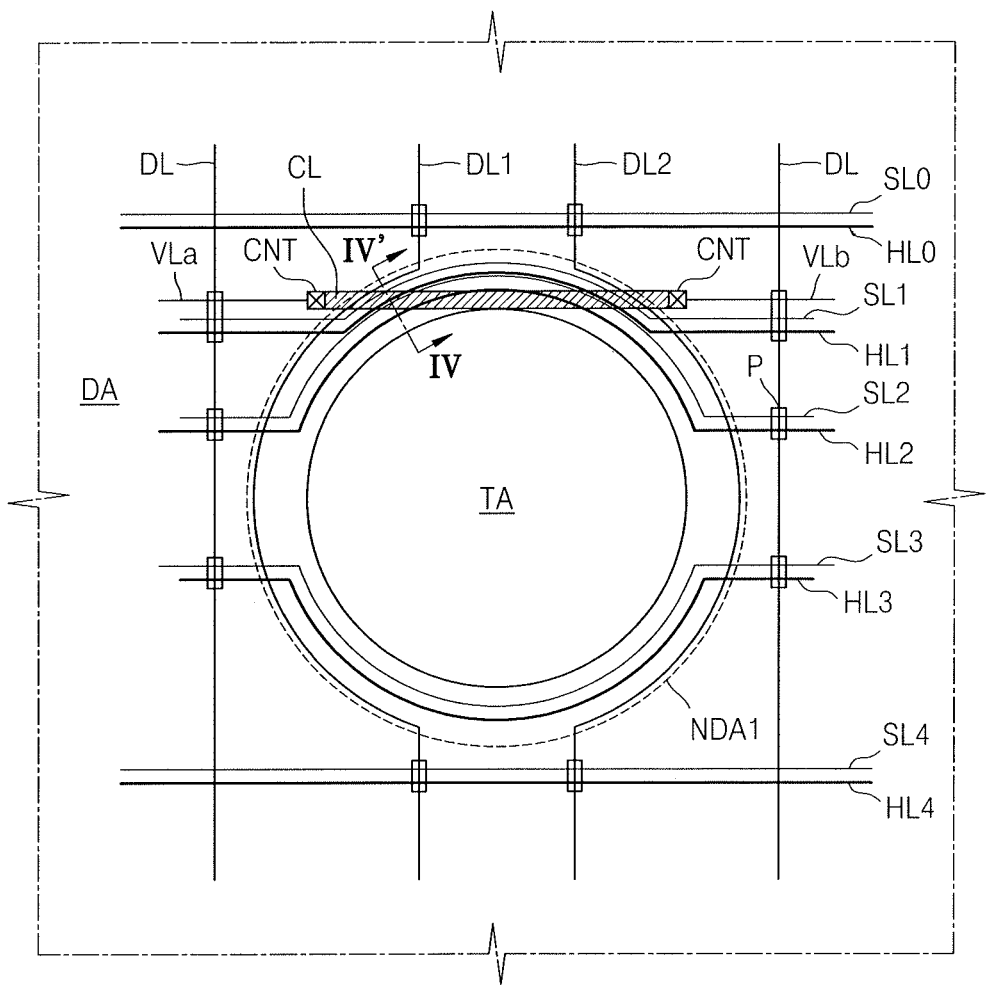
FIGS. 12A and 12B illustrate a plan view and a cross-sectional view of a display panel of another embodiment.

FIG. 11 illustrates a plan view of a display panel in which the transmissive area TA is inside the display area DA. FIG. 12A illustrates a plan view of some of wirings adjacent to the transmissive area TA of FIG. 11, and FIG. 12B illustrates a cross-sectional view of the wirings taken along line IV-IV' of FIG. 12A.

Referring to FIG. 11, the transmissive area TA may be entirely surrounded by the display area DA. The non-display area NDA may include the first non-display area NDA1 surrounding the transmissive area TA and the second non-display area NDA2 surrounding the display area DA. For example, the first non-display area NDA1 may entirely surround the transmissive area TA, and the display area DA may entirely surround the first non-display area NDA1, and the second non-display area NDA2 may entirely surround the display area DA.

Figure 12B:
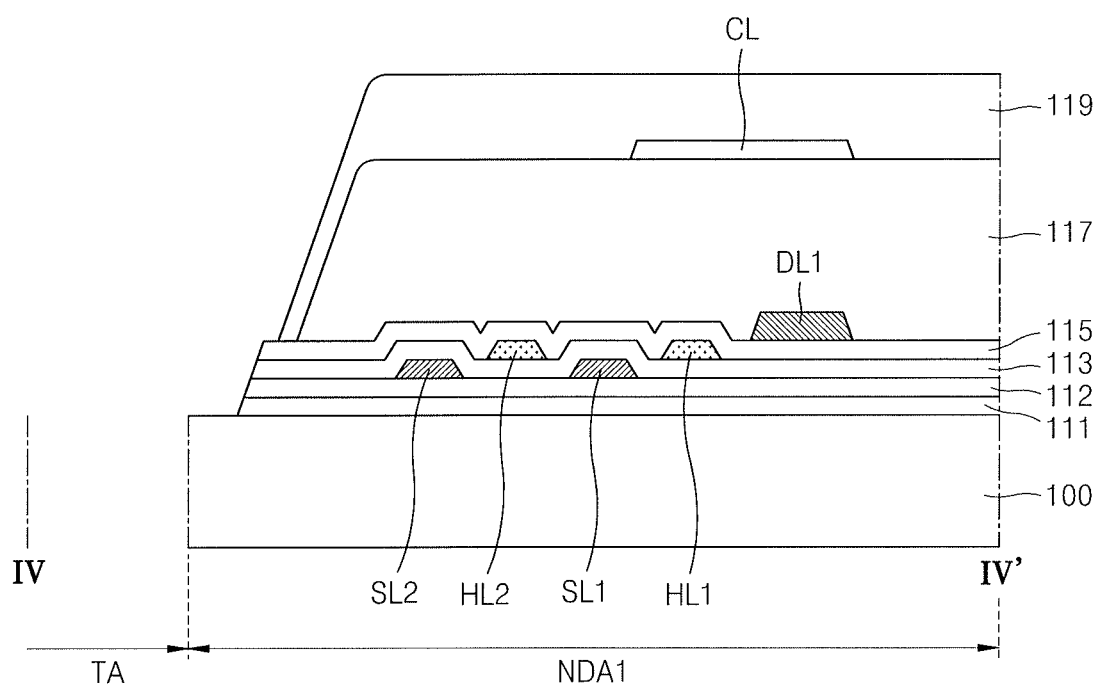

Referring to FIGS. 12A and 12B, in the display panel according to the present embodiment, the scan lines SL1 and SL2 and the electrode voltage lines HL1 and HL2 that extend in the first direction and detour along an edge of the transmissive area TA may be in the first non-display area NDA1 over or around the transmissive area TA. The connection line CL that overlaps at least a portion of the scan lines SL1 and SL2 and the electrode voltage lines HL1 and HL2 may be in the first non-display area NDA1 over or around the transmissive area TA.

In an implementation, data lines DL1 and DL2 may extend in the second direction and detour along an edge of the transmissive area TA. The data lines DL1 and DL2 may overlap at least a portion of the connection line CL.

In an implementation, the connection line CL may be on the planarization layer 117 on which the pixel electrode 210 (see FIG. 6B) is arranged and may include a straight line portion that extends in the first direction.

The connection line CL may be connected to the first line and the second line (that are respectively on different layers) through contact holes CNT and may electrically connect the first line to the second line.

In the present embodiment, the first line and the second line may respectively include initialization voltage lines VLa and VLb. The initialization voltage lines VLa and VLb may be arranged in the second gate insulating layer 113 (see FIG. 6B) which is the same layer as that of the electrode voltage lines HL1 and HL2. In this case, the connection line CL may be connected to the initialization voltage lines VLa an VLb through contact holes CNT that pass through the planarization layer 117 and the interlayer insulating layer 115. In an implementation, the contact hole CNT may be in the display area DA. In an implementation, the contact hole CNT may be in the first non-display area NDA1.

The scan lines SL1 and SL2 and the electrode voltage lines HL1 and HL2 that detour around an edge of the transmissive area TA may include a curved portion, and the scan lines SL1 and SL2 and the electrode voltage lines HL1 and HL2 may be on different layers. For example, the scan lines SL1 and SL2 may be on the first gate insulating layer 112, and the electrode voltage lines HL1 and HL2 may be on the second gate insulating layer 113.

In an implementation, the data lines DL1 and DL2 that detour an edge of the transmissive area TA may include a curved portion and may be on a layer different from that of the scan lines SL1 and SL2 and the electrode voltage lines HL1 and HL2. For example, the data lines DL1 and DL2 may be on the interlayer insulating layer 115.

Figure 13:
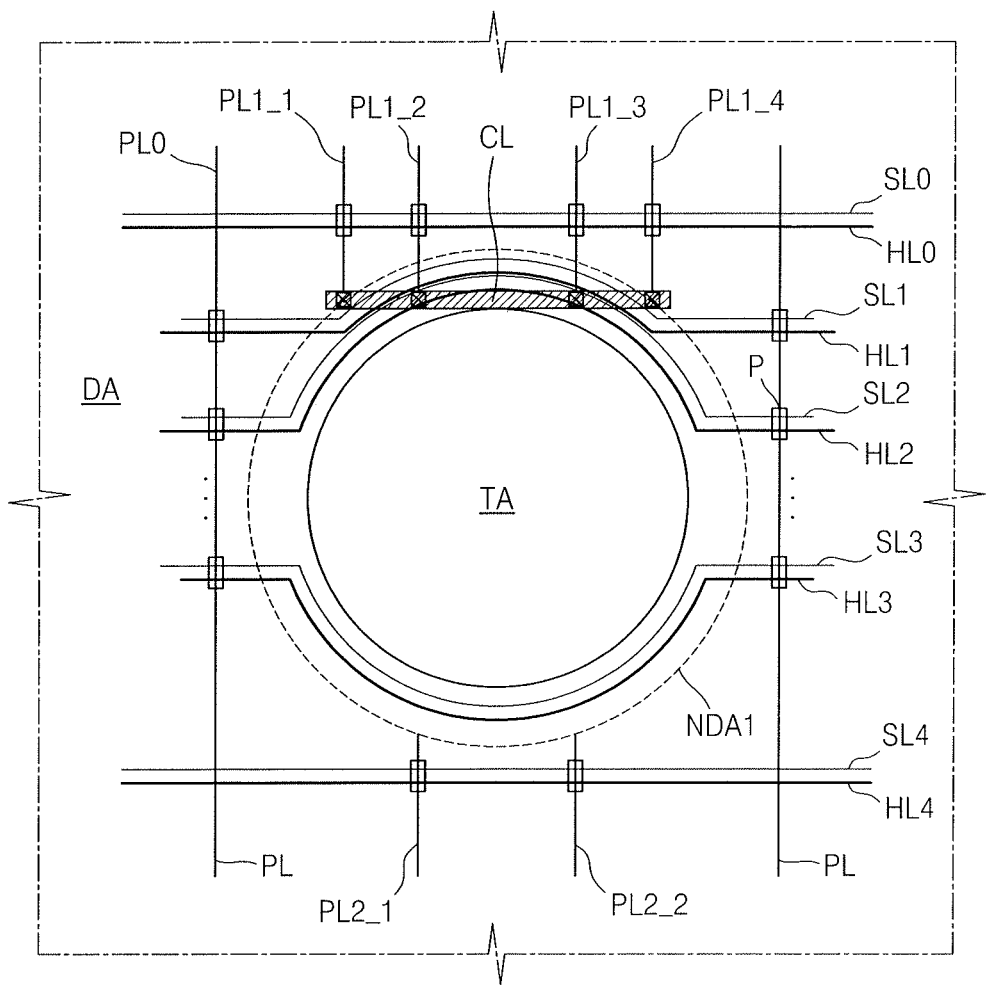
FIG. 13 illustrates a plan view of a display panel of another embodiment.

FIG. 13 illustrates a plan view of a display panel according to another embodiment. In FIG. 13, the transmissive area TA is entirely surrounded by the display area DA.

Referring to FIG. 13, in the display panel according to the present embodiment, the scan lines SL1 and SL2 and the electrode voltage lines HL1 and HL2 that detour along an edge of the transmissive area TA may be in the first non-display area NDA1 around the transmissive area TA. The connection line CL that overlaps at least a portion of the scan lines SL1 and SL2 and the electrode voltage lines HL1 and HL2 may be in the first non-display area NDA1 around the transmissive area TA.

In an implementation, the connection line CL may be on the planarization layer 117 on which the pixel electrode 210 (see FIG. 6B) is arranged and may include a straight line portion that extends in the first direction.

The connection line CL may be connected to the first line and the second line that are respectively on different layers through contact holes CNT and may electrically connect the first line to the second line.

In the present embodiment, the first line and the second line may extend in the second direction over the transmissive area TA and may be selected from driving voltage lines PL1_1, PL1_2, PL1_3, and PL1_4 that are spaced apart from each other in the first direction.

The driving voltage lines PL may be cut with the transmissive area TA therebetween. The driving voltage lines PL may contact the electrode voltage lines HL to form a net structure, even when the driving voltage lines PL are cut with the transmissive area TA therebetween, and the driving voltage lines PL may transfer the driving voltage ELVDD to each pixel.

In this case, the driving voltage lines PL2_1 and PL2_2 at one side of the transmissive area TA may be directly connected to the first power supply line 160 but the driving voltage lines PL1_1, PL1_2, PL1_3, and PL1_4 on the other side of the transmissive area TA may be indirectly connected to the first power supply line 160 through the electrode voltage lines HL, and an IR drop may be caused to the driving voltage ELVDD that is transferred to the pixels.

Therefore, a more stable driving voltage ELVDD may be transferred to the pixels over the transmissive area TA by connecting the driving voltage lines PL1_1, PL1_2, PL1_3, and PL1_4 at one side of the transmissive area TA using the connection line CL.

The driving voltage lines PL1_1, PL1_2, PL1_3, and PL1_4 may be on the interlayer insulating layer 115 (see FIG. 6B). In this case, the connection line CL may be connected to the driving voltage lines PL1_1, PL1_2, PL1_3, and PL1_4 through a contact hole CNT that passes through the planarization layer 117.

The connection line CL may be on the same layer as that of the pixel electrode 210, the connection line CL may overlap the scan lines SL1 and SL2 and the electrode voltage lines HL1 and HL2 that detour an edge of the transmissive area TA.

The scan lines SL1 and SL2 and the electrode voltage lines HL1 and HL2 that detour around an edge of the transmissive area TA may include a curved portion, and the scan lines SL1 and SL2 and the electrode voltage lines HL1 and HL2 may be arranged in different layers. For example, the scan lines SL1 and SL2 may be arranged on the first gate insulating layer 112, and the electrode voltage lines HL1 and HL2 may be arranged on the second gate insulating layer 113.

In an implementation, the data lines may extend in the second direction that intersects with the scan lines SL0, SL1, SL2, SL3, and SL4. In an implementation, some of the data lines may be curved to detour around an edge of the transmissive area TA.

By way of summation and review, as a method of increasing functionality that may be combined or made cooperate with a display device, a display panel may include a transmissive area in which a camera, a sensor, etc. may be arranged inside a display area, and a display device including the display panel.

According to the embodiments, a display quality may be improved by minimizing interferences between wirings that neighbor the transmissive area TA corresponding to an electronic element such as a sensor or a camera.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
a substrate including a transmissive area, a first non-display area surrounding the transmissive area, and a display area that at least partially surrounds the first non-display area;
a display element in the display area and including a pixel electrode;
a plurality of scan lines extending from the display area, arranged in the first non-display area, and detouring along an edge of the transmissive area;
a connection line in the first non-display area, at least partially overlapping the plurality of scan lines, and on a same layer as that of the pixel electrode; and
a first line and a second line on a layer different from that of the connection line,
wherein the first line and the second line are connected to the connection line through contact holes.

2. The display panel as claimed in claim 1, wherein:
the plurality of scan lines each extend in a first direction and include a curved portion in the first non-display area, and
the connection line extends in the first direction and includes a straight line portion in the first non-display area.

3. The display panel as claimed in claim 1, wherein the connection line is on a planarization layer having a flat top surface.

4. The display panel as claimed in claim 1, further comprising a plurality of electrode voltage lines adjacent to the plurality of scan lines with an insulating layer therebetween and detouring along an edge of the transmissive area.

5. The display panel as claimed in claim 4, wherein the plurality of scan lines does not overlap the plurality of electrode voltage lines.

6. The display panel as claimed in claim 4, further comprising:
a driving thin film transistor in the display area, the driving thin film transistor including a driving gate electrode; and
a storage capacitor in the display area, the storage capacitor overlapping the driving thin film transistor,
wherein:
the plurality of scan lines are on the same layer as that of the driving gate electrode, and
the plurality of electrode voltage lines are on the same layer as that of a second storage capacitor plate of the storage capacitor.

7. The display panel as claimed in claim 1, further comprising a first scan circuit and a second scan circuit in a second non-display area surrounding the display area and the first non-display area, the first scan circuit and the second scan circuit being configured to provide a scan signal, wherein:
the transmissive area is partially surrounded by the display area,
the first line is connected to the first scan circuit and extends along the second non-display area, and
the second line is connected to the second scan circuit and extends along the second non-display area.

8. The display panel as claimed in claim 7, further comprising a common power voltage wiring in the second non-display area, the common power voltage wiring surrounding at least a portion of the display area and being configured to transfer a common voltage to the display area,
wherein the connection line is between the transmissive area and the common power voltage wiring.

9. The display panel as claimed in claim 7, further comprising an electrode layer in the first non-display area, the electrode layer being on the same layer as that of the connection line and having an open ring shape.

10. The display panel as claimed in claim 1, wherein:
the first non-display area is entirely surrounded by the display area, and
the first line and the second line extend from the display area.

11. The display panel as claimed in claim 10, wherein:
the connection line extends in a first direction and the first line, and
the second line extends in a second direction intersecting with the first direction.

12. A display panel, comprising:
a substrate including a transmissive area, a display area partially surrounding the transmissive area, and a non-display area outside the display area;
a display element in the display area and including a pixel electrode;
a first scan driving circuit and a second scan driving circuit in the non-display area with the display area therebetween;
a first driving wiring extending from the first scan driving circuit;
a second driving wiring extending from the second scan driving circuit; and
a connection line connected to the first driving wiring and the second driving wiring through contact holes and being on the same layer as that of the pixel electrode,
wherein the connection line is in the non-display area on one side of the transmissive area.

13. The display panel as claimed in claim 12, wherein:
the first driving wiring and a second driving wiring extend in a first direction and include a curved portion around the transmissive area, and
the connection line extends in the first direction and includes a straight line portion overlapping with the curved portion.

14. The display panel as claimed in claim 12, wherein the connection line is on a planarization layer having a flat top surface.

15. The display panel as claimed in claim 12, further comprising a plurality of electrode voltage lines adjacent to the first driving wiring and a second driving wiring with an insulating layer therebetween and detouring around an edge of the transmissive area.

16. The display panel as claimed in claim 15, further comprising:
an interlayer insulating layer covering the plurality of electrode voltage lines;
a data line on the interlayer insulating layer; and
a planarization layer covering the data line,
wherein:
the first driving wiring and the second driving wiring are on the interlayer insulating layer, the connection line is on the planarization layer, and a thickness of the planarization layer is greater than a thickness of the interlayer insulating layer.

17. The display panel as claimed in claim 15, further comprising:
- a driving thin film transistor in the display area, the driving thin film transistor including a driving gate electrode; and
- a storage capacitor in the display area, the storage capacitor overlapping the driving thin film transistor, wherein:

the plurality of scan lines are on the same layer as that of the driving gate electrode, and the plurality of electrode voltage lines are on the same layer as that of a second storage capacitor plate of the storage capacitor.

18. The display panel as claimed in claim 15, wherein the plurality of scan lines do not overlap the plurality of electrode voltage lines.

19. The display panel as claimed in claim 12, further comprising a common power voltage wiring in the non-display area, the common power voltage wiring surrounding at least a portion of the display area and being configured to transfer a common voltage to the display area, wherein the connection line is between the transmissive area and the common power voltage wiring.

20. The display panel as claimed in claim 12, further comprising an electrode layer around the transmissive area, the electrode layer being on the same layer as that of the connection line and having an open ring shape.

* * * * *